(12) United States Patent
Nakada et al.

(10) Patent No.: US 7,272,270 B2
(45) Date of Patent: Sep. 18, 2007

(54) OPTICAL MODULATOR AND METHOD OF MANUFACTURING SAME

(75) Inventors: Masafumi Nakada, Tokyo (JP); Keishi Ohashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/496,817

(22) Filed: Aug. 1, 2006

(65) Prior Publication Data

US 2006/0269182 A1    Nov. 30, 2006

Related U.S. Application Data

(62) Division of application No. 11/091,134, filed on Mar. 28, 2005, now Pat. No. 7,162,109.

(30) Foreign Application Priority Data

Mar. 30, 2004    (JP)    ............................ 2004-099114

(51) Int. Cl.
*G02F 1/035* (2006.01)
*H01S 3/00* (2006.01)
*H04J 14/02* (2006.01)

(52) U.S. Cl. ...................... 385/2; 385/1; 385/8; 385/14; 385/53; 385/24; 385/40; 385/100; 359/247; 359/260; 359/346; 398/82; 398/85

(58) Field of Classification Search .................... 385/1, 385/2, 3, 4, 5, 8, 14, 24, 40, 53, 100; 359/341.1, 359/341.3, 247, 260, 346; 372/92, 98, 99, 372/101; 398/82, 85
See application file for complete search history.

(56) References Cited

U.S. PATENT DOCUMENTS

| | | | | |
|---|---|---|---|---|
| 5,253,099 A | * | 10/1993 | Heidemann | 359/260 |
| 5,345,328 A | * | 9/1994 | Fritz et al. | 359/248 |
| 5,386,137 A | * | 1/1995 | Dell et al. | 257/458 |
| 6,154,475 A | * | 11/2000 | Soref et al. | 372/45.011 |
| 6,873,631 B2 | * | 3/2005 | Yao et al. | 372/32 |
| 7,162,109 B2 | * | 1/2007 | Nakada et al. | 385/2 |
| 2004/0008928 A1 | | 1/2004 | Gerken et al. | 385/24 |
| 2005/0220386 A1 | * | 10/2005 | Nakada et al. | 385/1 |
| 2006/0215713 A1 | * | 9/2006 | Flanders et al. | 372/20 |

FOREIGN PATENT DOCUMENTS

| | | | |
|---|---|---|---|
| JP | 61-088229 | 5/1986 | ............... 385/14 X |
| JP | 01-136116 | 5/1989 | ............... 385/14 X |
| JP | 2002-235181 | 8/2002 | ............... 438/29 X |

* cited by examiner

*Primary Examiner*—Brian M. Healy
(74) *Attorney, Agent, or Firm*—Scully, Scott, Murphy & Presser, P.C.

(57) ABSTRACT

Laser light emitted from a vertically confined surface emitting laser (VCSEL) is incident on a side surface near an end region of an optical waveguide. The end region of the optical waveguide is processed by polishing to taper at an angle of 45 degrees, and an optical modulator is formed on the polished surface. The optical modulator is a Fabry-Perot modulator using a linear electro-optical effect. The modulator has a thick transparent electro-optical layer which is deposited by using an aerosol deposition method.

22 Claims, 15 Drawing Sheets

OPTICAL MODULATOR AND METHOD OF MANUFACTURING SAME

CROSS REFERENCE TO RELATED APPLICATION

The present application is a divisional application of U.S. patent application Ser. No. 11/091,134 filed on Mar. 28, 2005, now U.S. Pat. No. 7,162,109.

BACKGROUND OF THE INVENTION (1) Field of the Invention

The present invention relates to an optical modulator which modulates light from a semiconductor laser or light source at high speeds for transmission, and more particularly, to such an optical module for use in high-speed, large-capacity optical communications and optical interconnections.

(2) Description of the Related Art

Optical communication networks have enabled communication of large quantities of information. However, according to the estimates of scholars, the communication infrastructure in Japan will experience shortages of capacity due to rapid increases in the amount of data communications and will become incapable of responding to the demand within five years, at the earliest. It is said that the tendency for capacity shortage will be accelerated by the proliferation of broadband communications and mobile telephone communications including high quality moving images.

At present, Ethernet (registered trademark) is widely used as a communication protocol which supports the Internet protocol (IP), however, current communication systems have just begun practical communications at 10 Gbps. Imminent requirements exist for the development of communication technologies which provide communication at 40 Gbps or higher for inter-city (metro) communications and the like which involve heavy communication traffic, though not over large distances.

In addition, at present, optical modulation which directly modulates the current of a semiconductor laser (e.g., laser diode (LD)) that is a light source is widely employed in optical transmitters because of its simple configuration. For marine optical cable communications which involve long distance transmissions, external optical modulators are employed because the charping of transmitted light caused by the direct modulation of LD causes degradation in waveforms due to the relationship to group velocity dispersion in optical fibers.

Modulation frequencies beyond 10 GHz cause many optical components to have poor performance. LD-based direct modulation produces a delay in the change in the density of an injected carrier over time, thus encountering difficulties in modulation at a relaxation oscillation frequency or higher. An external optical modulator that uses a ferroelectric crystal experiences difficulties in matching the output impedance of a driving source due to a lower impedance of the device, thereby resulting in a failure in providing sufficient modulation characteristics.

Likewise, in electronic circuits and LSIs for processing digital signals, the transmission of signals at higher speeds results in difficulties in the transmission of signals through metal wires particularly between circuits and between chips, so that there is an immediate need for the development of new technologies for optical fiber lines, optical interconnections, and the like. In this case, since multiple optics are integrated in a chip, another essential requirement, in addition to improved speed, is reduced size.

From the foregoing, it is no exaggeration to say that a key to enabling optical communication and optical wiring technologies at communication speeds exceeding 40 Gbps is to develop small and low-cost optical modulators.

Mach-Zehnder waveguide optical modulator is one of the optical modulators, at present, that have a practical use. This modulator relies on an electro-optical effect to provide a phase difference between waveguided lights which propagate through two arms that are branched in a Y-shape. As the waveguided lights which have propagated through both arms are combined again at a Y-shaped branch, the intensity of the combined light is modulated in accordance with the provided phase difference. This modulator employs a Ti thermally diffused waveguide made of electro-optical crystals of ferroelectric lithium niobate.

An expensive optical modulator for optical communications, in which an intensive optical modulator and an edge emission distributed feedback laser are monolithically integrated, is provided. The intensive optical modulator has advantage of an electro absorption effect in which an inverse bias is applied to an optical semiconductor crystal, a Frantz-Keldish effect, or a quantum confined Shutark effect (QCSE).

On the other hand, up to the present, the optical path length n·d (where $\underline{n}$ is the refractive index, and $\underline{d}$ is a geometric thickness) of a Fabry-Perot Ethalon surface resonator was actively changed to control the wavelength sweeping and the transmission wavelength of a filter by repeated multiple reflection interference. If the wavelength of incident light is fixed, this operation corresponds the optical modulation of an optical modulator.

An example of such optics is a variable wavelength filter made of an optical semiconductor material as disclosed in JP-10-136116-A (see pages 3-4 and FIG. 4). This wavelength filter, which includes a multi-quantum well (MQW) layer sandwiched by highly reflective films, varies the wavelength which is transmitted by the filter by applying an electric field between the reflective films to change the refractive index of the MQW layer.

JP-10-136116-A also describes the utilization of a change in the refractive index through a carrier plasma effect and a band filling effect which can be produced through current injection.

In addition, JP-61-088229-A (see pages 2-3 and FIGS. 1-3) discloses another example of a variable wavelength filter made of a transparent dielectric material. This variable wavelength filter is composed of a quartz glass substrate; dielectric multi-layer light reflection films each made of $TiO_2$ and $SiO_2$; a polycrystalline film made of PLZT (La doped oxide zirconium, oxide titanium and oxide lead compound) in a thickness of approximately 200 nm which has an electro-optical effect; and a dielectric multi-layer film identical to the foregoing. These components are sequentially deposited on the quartz glass substrate by a sputtering method to form an Ethalon resonator. The wavelength transmitted by the filter is controlled by applying a voltage between the reflection films, making use of a change in the refractive index which is assumed to be attributable to a secondary electro-optical effect (Kerr effect).

This device encounters difficulties in forming a thick ferroelectric film to increase voltage sensitivity. On the other hand, the ferroelectric film can be deposited by a CVD (chemical vapor deposition) method, vapor deposition, a sol/gel method, and a method of manufacturing a composite structure as disclosed by JP-2002-235181-A (see page 16 and FIGS. 11, 13-14), other than the sputtering method.

However, any of the prior art optical modulators described above cannot successfully meet all requirements for application in optical communication and optical wiring technologies at 40 Gbps or higher such as faster operation, reduction in driving voltage, reduction in size, an arrayed arrangement, lower cost, and the like.

A Mach-Zehnder optical modulator which employs a Ti thermally diffused waveguide made of electro-optical crystals of ferroelectric lithium niobate has dimensions on the order of several centimeters, and a long device length because of a small specific refractive index difference and a small waveguide turnout angle. Also, the Mach-Zehnder optical modulator requires a high driving voltage because of a small electro-optical constant presented by the material. Further, the Mach-Zehnder optical modulator has limitations when operating at 20 GHz because of difficulties in matching a characteristic impedance of a travelling wave electrode, which is applied with a modulation signal, with a driving source.

The lumped circuit type optical modulator that takes advantage of an electro absorption effect with an inverse bias applied to an optical semiconductor crystal, or a quantum confined Shutark effect, entails a high manufacturing cost because of the requirement for advanced and complicated compound semiconductor crystallization technologies and lithography. This makes the lumped circuit type optical modulator unsuitable for applications in optical wiring which often involves a plurality of elements arranged in array.

The optical modulator device (JP-01-136116-A) which includes a wavelength filter made up of a multi-quantum well (MQW) layer of an optical semiconductor sandwiched by highly reflective films and which varies a wavelength transmitted by the filter, entails a high cost because the substrate is limited to crystals which match the condition of crystal growth layer in lattice and there is a need for a crystal growth technology based on advanced apparatuses. Also, difficulties in forming a thick MWQ layer inevitably contribute to a lower sensitivity. Further, since the optical modulator device utilizes the red shift of a fundamental absorption end near the transmission wavelength caused by an applied voltage, a change in the refractive index is accompanied by a coincident change in light absorption, causing the device to invariably suffer from a high light insertion loss. If the blue shift by carrier injection is utilized, noise light, such as naturally emitted light, is generated in addition to a coincidental change in light absorption. Consequently, the technologies described in JP-01-136116-A are not effective for application in light control devices such as an optical modulator, a variable wavelength filter and the like.

In the optical modulator device (JP-61-088229-A) which includes an Ethalon resonator made of PLZT having an electro-optical effect on a quartz glass substrate, it is difficult to form a thick ferroelectric film to increase the sensitivity to the voltage. Supposing that the optical modulator device includes a thick ferroelectric film, the quality of the film would be degraded, resulting in increased light scattering, worsened spatial coherence of light, and increased light loss. Also, since the optical modulator device is estimated to utilize the Kerr effect, the device has a problem of poor controllability due to hysteresis introduced in the voltage versus light transmission characteristic.

The sputtering method used for depositing the ferroelectric material, described in JP-61-088229-A, can produce an optically high quality film in a thickness of 2 μm or less at most. Also, the manufacturing method disclosed in JP-2002-235181 for depositing a ferroelectric film has never successfully produced an optically high quality film. In order to increase the impedance and reduce the voltage of the Ethalon resonator type optical modulator, it is necessary to increase the film thickness five times larger than can be done by conventional methods.

SUMMARY OF THE INVENTION

The present invention has been made in view of the problems experienced by the conventional optical modulators, and it is an object of the invention to provide a highly sensitive and compact optical modulator which facilitates impedance matching with a driving source, has light modulation characteristics including ultra-high speeds exceeding 40 Gbps and a low driving voltage, and can be utilized in optical wiring and the like, and to provide a method for manufacturing such an optical modulator.

It is another object of the present invention to provide a optical modulation system which employs the optical modulator described above, as well as an optical interconnect device and an optical communication device which use the optical modulation system.

The present invention has been made based on the knowledge that realizing the operation of an optical modulator at an ultra-high frequency and with a low driving voltage, can be done by increasing the impedance of the device at high frequencies beyond the impedance of a driving source, as described above. In addition, the present invention aims at increasing the thickness of an electro-optical layer in accordance with the basic idea for accomplishing the operation with a low driving voltage.

An optical module according to one aspect of the present invention is driven by an external driving source, and is characterized by including a Fabry-Perot resonator type optical modulation unit formed on a substrate, wherein the optical modulation unit includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and the optical modulation unit has a reactance, the absolute value of which is higher than the impedance of the external driving source in the frequency range equal to or lower than 200 GHz.

According to the foregoing configuration, since the impedance of the optical modulator, which is a capacitive load, is high in a high frequency range as well, the output voltage of the driver can respond to the modulation at high frequencies. Consequently, the refractive index of the electro-optical layer can also be changed at high speeds, thereby enabling high-speed modulation.

In the optical modulator described above, the electro-optical layer may have a linear electro-optical effect.

An optical modulator according to another aspect of the present invention is driven by an external driving source, and is characterized by including a Fabry-Perot resonator type optical modulation unit formed on a substrate, wherein the optical modulation unit includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and the electro-optical layer has a linear electro-optical effect.

In each optical modulator, the electro-optical layer may be made of a single crystal or a sintered compact. Also, the electro-optical layer may be formed by a deposition method. Further, the electro-optical layer may be deposited by an aerosol deposition method. Since the aerosol deposition can deposit a film in a thickness of several μm or more, the electro-optical layer can be deposited in a large thickness. As a result, a lower driving voltage can be applied to the optical modulator to reduce the capacitance and increase the impedance. The composition of the electro-optical layer may include either lead zirconate titanate, or lead zirconate titanate added with lanthanum, or KTN (kalium tantalum niobate). The optical modulator may be formed on a curved surface arranged on the substrate. The curved surface may be a concave.

An optical modulation system according to one aspect of the present invention includes a light source, an optical modulator driven by an external driving source for modulating light emitted from the light source, and an optical waveguide for guiding modulated light modulated by the optical modulator, and is characterized in that the optical modulator is a Fabry-Perot resonator type optical modulator formed on a substrate, which includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and the optical modulator has a reactance, the absolute value of which is higher than the impedance of the external driving source in the frequency range equal to or lower than 200 GHz.

A optical modulation system according to another aspect of the present invention includes a light source, an optical modulator for modulating light emitted from the light source, and an optical waveguide for guiding modulated light modulated by the optical modulator, and is characterized in that the optical modulator is a Fabry-Perot resonator type optical modulator formed on a substrate, which includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and the electro-optical layer has a linear electro-optical effect.

In each optical modulation system, the optical waveguide may have an end surface inclined with respect to the optical axis of the optical waveguide, the optical modulator may be formed on the inclined surface, and the light source may be disposed such that the light emitted therefrom is transmitted through a side surface of the optical modulator and is incident on the optical modulator. Alternatively, the end surface of the optical waveguide may be vertical to the optical axis of the optical waveguide, the optical modulator may be formed on the vertical surface, and the light source may be disposed such that the light emitted therefrom is incident on the optical modulator at right angles. The optical modulation system may further include a lens for coupling the light emitted from the light source to waveguided light of the optical waveguide. The optical modulation system may further include an optical modulator support having a reflective surface for converting the emission optical axis of the light source to the optical axis of the optical waveguide, wherein the optical modulator may be formed on the reflective surface of the optical modulator support. The reflective surface may be a concave. The concave may have a curvature for focusing light emitted from the light source on the optical waveguide.

An optical interconnect device according to one aspect of the present invention has a optical modulation system including a substrate, a light source having an emission optical axis vertical to the surface of the substrate, an optical waveguide having an optical axis parallel with the surface of the substrate, and an optical modulator, and is characterized in that the optical modulation system is any of the optical modulation systems according to the aspects of the present invention described above, the optical waveguide has an end surface inclined with respect to the optical axis of the optical waveguide, the optical modulator is formed on the inclined surface, and the light source is disposed such that the light emitted therefrom is transmitted through a side surface of the optical waveguide and is incident on the optical modulator.

An optical interconnect device according to another aspect of the present invention has a optical modulation system including a substrate, a light source having an emission optical axis vertical to the surface of the substrate, an optical waveguide having an optical axis parallel with the surface of the substrate, and an optical modulator, and is characterized in that the optical modulation system is any of the optical modulation systems according to the present invention described above, and includes an optical modulator support having a reflective surface for converting the emission optical axis of the light source to the optical axis of the optical waveguide, and the optical modulator is formed on the reflective surface of the optical modulator support.

An optical communication device according to one aspect of the present invention has a optical modulation system including a substrate, a light source having an emission optical axis vertical to the surface of the substrate, an optical waveguide having an optical axis parallel with the surface of the substrate, and an optical modulator, and is characterized in that the optical modulation system is any of the optical modulation systems according to the present invention described above, the optical waveguide has an end surface inclined with respect to the optical axis of the optical waveguide, the optical modulator is formed on the inclined surface, and the light source is disposed such that the light emitted therefrom is transmitted through a side surface of the optical waveguide and is incident on the optical modulator.

An optical communication device according to another aspect of the present invention has a optical modulation system including a substrate, a light source having an emission optical axis vertical to the surface of the substrate, an optical waveguide having an optical axis parallel with the surface of the substrate, and an optical modulator, and is characterized in that the optical modulation system is any of the optical modulation systems according to the present invention described above, and includes an optical modulator support having a reflective surface for converting the emission optical axis of the light source to the optical axis of the optical waveguide, and the optical modulator is formed on the reflective surface of the optical modulator support.

A method of manufacturing an optical modulator according to the present invention is characterized by including the steps of, forming a Fabry-Perot resonator type optical modulator on a substrate, wherein the optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and determining the thickness of the electro-optical layer such that an absolute value of a reactance formed by the optical modulator is higher than the impedance of an external driving source for driving the optical modulator in the frequency range equal to or lower than 200 GHz.

Another method of manufacturing an optical modulator according to the present invention is characterized by including the steps of, forming a Fabry-Perot resonator type optical modulator on a substrate, wherein the optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and developing a linear electro-optical effect possessed by the electro-optical layer.

In the respective manufacturing methods described above, the electro-optical layer may be made of a single crystal or a sintered compact. Also, the electro-optical layer may be formed by a deposition method. Further, the electro-optical may be deposited by an aerosol deposition method.

As will be appreciated from the foregoing, the present invention can realize a highly sensitive and compact optical modulator and optical modulation system which have ultra-high speed optical modulation characteristics, and can be utilized even in optical wiring and the like. Moreover, the present invention can provide an optical interconnect device and an optical communication device which employ the optical modulation system as described above.

The above and other objects, features, and advantages of the present invention will become apparent from the following description with reference to the accompanying drawings which illustrate examples of the present invention.

DESCRIPTION OF THE PREFERRED EMBODIMENTS

First Embodiment

Figure 1:
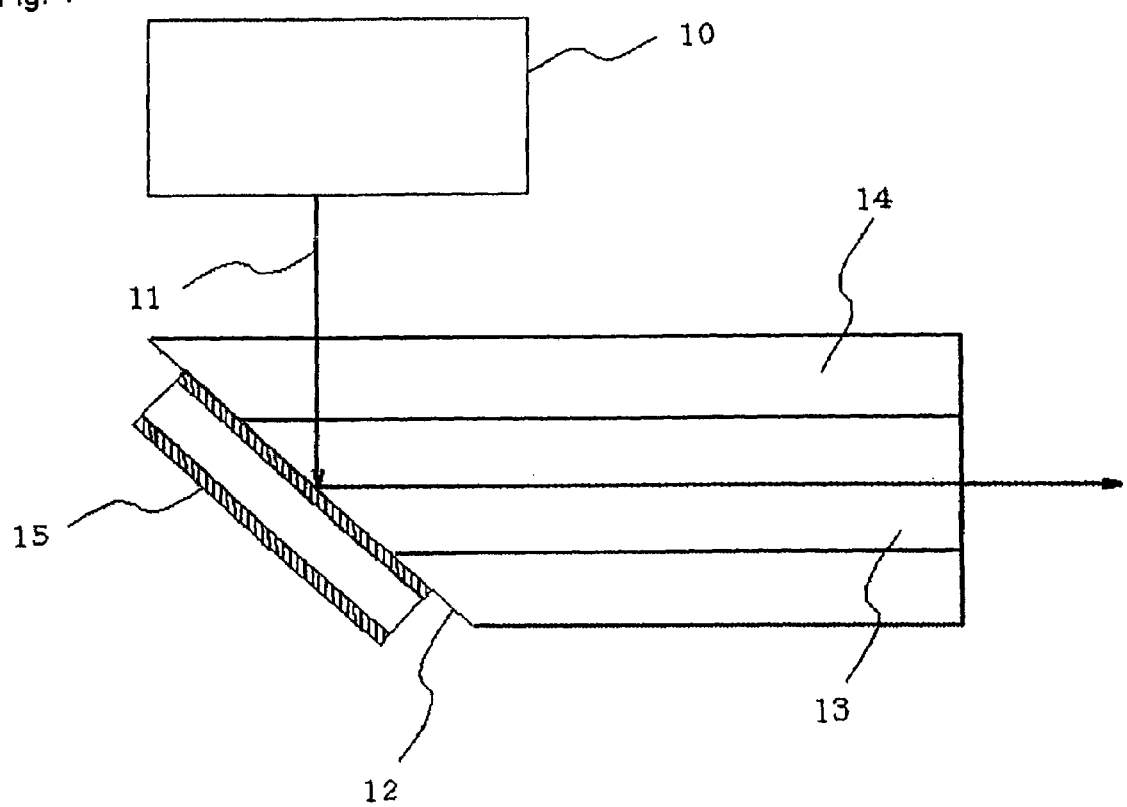
FIG. 1 is a diagram illustrating the configuration of a first embodiment of a optical modulation system according to the present invention.

FIG. 1 illustrates the configuration of a first embodiment of a optical modulation system which includes an optical modulator according to the present invention. Laser light 11 emitted from vertically confined surface emitting laser (VC-SEL) 10 is incident on a side surface near an end of optical waveguide 12. Optical waveguide 12 comprises core layer 13, and cladding layer 14 surrounding core layer 13. An end region of optical waveguide 12 is processed by polishing to taper at an angle of 45°, and optical modulator 15 is formed on the polished surface. Optical modulator 15 is placed at such a position that light reflected thereby enters core layer 14 of optical waveguide 12.

Optical modulator 15 comprises a Fabry-Perot resonator. Light incident on optical modulator 15 repeatedly reflects within and interferes with optical modulator 15, causing a change in the intensity ratio of straight ahead transmitted light to 90° reflected light in accordance with an optical path length n·d (where $n$ is the refractive index, and $d$ is a geometrical thickness) within optical modulator 15. When optical modulator 15 is not applied with any voltage, the optical path length d·n within optical modulator 15 is set such that the straight ahead transmitted light of the incident laser light has an intensity equal to one at the wavelength at which VCSEL 10 oscillates, while the 90° reflected light has the intensity equal to zero. As optical modulator 15 is applied with a voltage, the refractive index n changes due to the electro-optical effect which changes the intensity of the straight ahead transmitted light of the incident laser light to zero, and which changes the intensity of the 90° reflected light to one, so that the incident light is fully introduced into core 13 of optical waveguide 12. With this operation, the application of laser light to waveguide 12 can be turned on and off.

Alternatively, the optical path length of optical modulator 15 can be set such that the intensity of the 90° reflected light changes to one when no voltage is applied to optical modulator 15. In this way, an optical bias can be arbitrarily set.

To increase the coupling efficiency of laser light 11 to optical waveguide 12, an anti-reflection film is preferably formed on the light transmission surface of optical waveguide 12. Also, a focusing lens can be disposed between VCSEL 10 and optical modulator 15 as required.

Also, while optical modulator 15 is formed in an end region of optical waveguide 12 in the first embodiment, an end region of an optical fiber may be processed to have a tapered surface on which optical modulator 15 can be formed. In addition, the light source is not limited to VCSEL, but an edge emitting laser, LED, and the like can be used for the light source.

[First Example of Optical Modulator]

Figure 2:
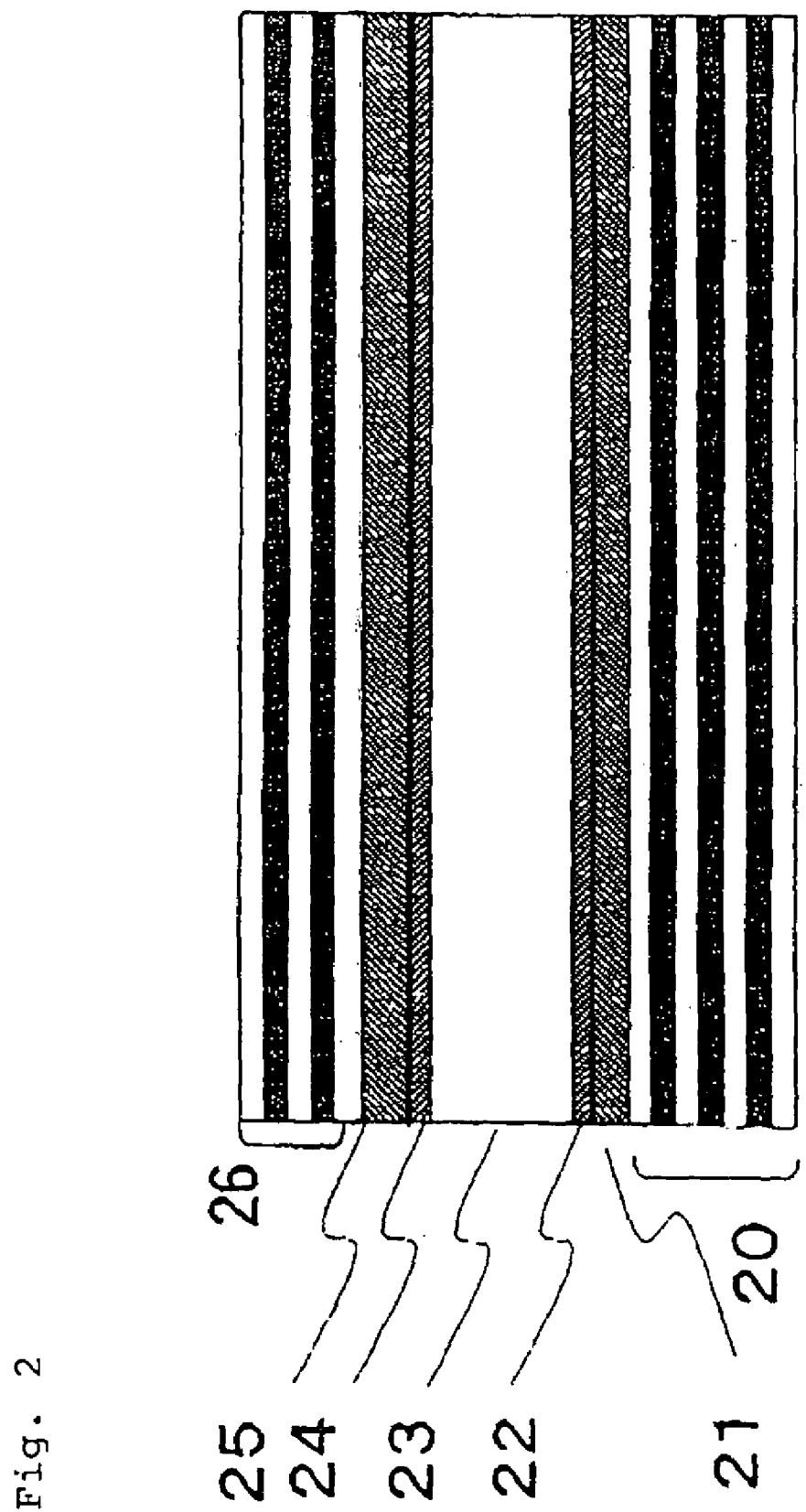
FIG. 2 is a diagram illustrating the structure, viewed in cross-section, of a first example of an optical modulator according to the present invention.

FIG. 2 illustrates the structure, viewed in cross-section, of optical modulator 15 which is a first example of the optical modulator according to the present invention. The following description will focus on a method of manufacturing this optical modulator.

First, dielectric multi-layer reflective layer 20 is formed by an ion plating method. Lower dielectric multi-layer reflective layer 20 is composed of many layers of an $SiO_2$ film (303 nm thick) and a $Ta_2O_5$ film (186 nm thick) which are alternately deposited one on the other. Here, the thickness was controlled during the deposition by opening and closing a shutter on a deposition source while measuring the optical spectrum on a monitor.

Next, lower electrode layer 21, i.e., an ITO thin film which is highly transparent at the wavelength of laser light emitted by VCSEL is deposited by a sputtering method. Specifically, the ITO thin film is deposited using $In_2O_3$—$SnO_2$ (10 wt %) as a target and a mixture of argon and oxygen as a sputtering gas. The temperature on a substrate is 250° C., and the ITO thin film is deposited in a thickness of 235 nm. Other than ITO, lower electrode layer 21 can be made, for example, of a low electric resistance material such as ZnO which is transparent at the wavelength of laser light from VCSEL. In any case, it is important to increase the transmittance at the wavelength of laser light from VCSEL and to reduce the electric resistance by controlling the deposition condition, composition, and carrier concentration.

Next, lower intermediate layer 22 is formed on lower electrode layer 21 by an ion plating method. Lower intermediate layer 22 is formed for purposes of reducing the influence of light scattering caused by a rough interface which is formed when electro-optical layer 23 is deposited, and is required to have a thickness of 20 nm or more. In this example, the thickness of lower intermediate layer 22 was chosen to be 100 nm. Also, for preventing Fresnel reflection on the interface between lower intermediate layer 22 and electro-optical layer 23, lower intermediate layer 22 is required to have a refractive index close to or equal to that of electro-optical layer 23. In this example, lower intermediate layer 22 is made of $Ta_2O_5$ film.

An aerosol deposition method, in which an ultra-fine particle fragile material is crushed by applying the same with a mechanical impact force, and crushed particles are bonded to form a molded structure, is used to form electro-optical layer 23. Electro-optical layer 23 has a thickness of 6000 nm. $Pb(Zr0.6Ti0.4)O_3$ is used as raw powder, and nitrogen is used as a carrier gas. The incident angle of a nozzle to the substrate is 10 degrees, the amount of gas flow is 12 liters/minute, the distance between the nozzle and the substrate is 5 mm, the deposition rate is 0.8 μm/minute, and a vibrator vibrates at 250 rpm. Electro-optical layer 23 is deposited under the foregoing conditions.

After the deposition of electro-optical layer 23, heat treatment is performed at 600° C. for approximately 15 minutes in the atmosphere while applying an electric field of approximately 100 kV/cm to develop the linear electro-optical effect of electro-optical layer 23. In this event, the primary electro-optical coefficient r33 was 200 pm/V. After heat treatment, the surface of electro-optical layer 23 is flatly polished until the thickness is reduced to 5400 nm in order to remove ruggedness on the surface of electro-optical layer 23.

Upper intermediate film 24 is deposited on the flat surface of electro-optical layer 23 by an ion plating method. Upper intermediate layer 24 is formed for purposes of adjusting the optical thickness between reflective layers required to build a Fabry-Perot resonator, i.e., the sum total of the optical thicknesses of lower intermediate layer 22, electro-optical layer 23, and upper intermediate layer 24. Here, upper intermediate layer 24 was deposited so as to have a predetermined thickness while measuring the optical spectrum on a monitor during the deposition. Upper intermediate layer 24 is required to have a refractive index close to or equal to that of electro-optical layer 23 for preventing Fresnel reflection on the interface between upper intermediate layer 24 and electro-optical layer 23. In this example, a Fabry-Perot resonator was formed by laminating upper intermediate layer 24, which was a $Ta_2O_5$ film (80 nm thick), on electro-optical layer 23.

Next, an ITO thin film, which serves as upper electrode layer 25, is deposited on upper intermediate layer 24 by a sputtering method. Upper electrode layer 25 has a thickness of 235 nm. The deposition conditions are the same as those for lower electrode layer 21.

Finally, upper dielectric multi-layer reflective layer 26 is formed on upper electrode layer 25 by an ion plating method. Upper dielectric multi-layer reflective layer 26 is formed by repeatedly laminating an $SiO_2$ film (303 nm thick) and a $Ta_2O_5$ film (186 nm thick). Here, the thicknesses were controlled during the deposition by opening and closing the shutter on the deposition source while measuring the optical spectrum on a monitor.

While in the foregoing description, electro-optical layer 23 has the composition represented by $Pb(Zr0.6Ti0.4)O_3$, electro-optical layer 23 in the present invention is not limited to this composition. For example, electro-optical layer 23 may be made of a single crystal or sintered compact. Also, electro-optical layer 23 may additionally include La in its composition. Further, other than lead zirconate titanate based materials, $KTN(KTaNbO_3)$, $BaTiO_3$ and the like, which exhibit large electro-optical effects, are effective materials for electro-optical layer 23. However, any material having high electro-optical characteristics can be used for electro-optical layer 23, and are not limited to the foregoing described materials.

Figure 3:
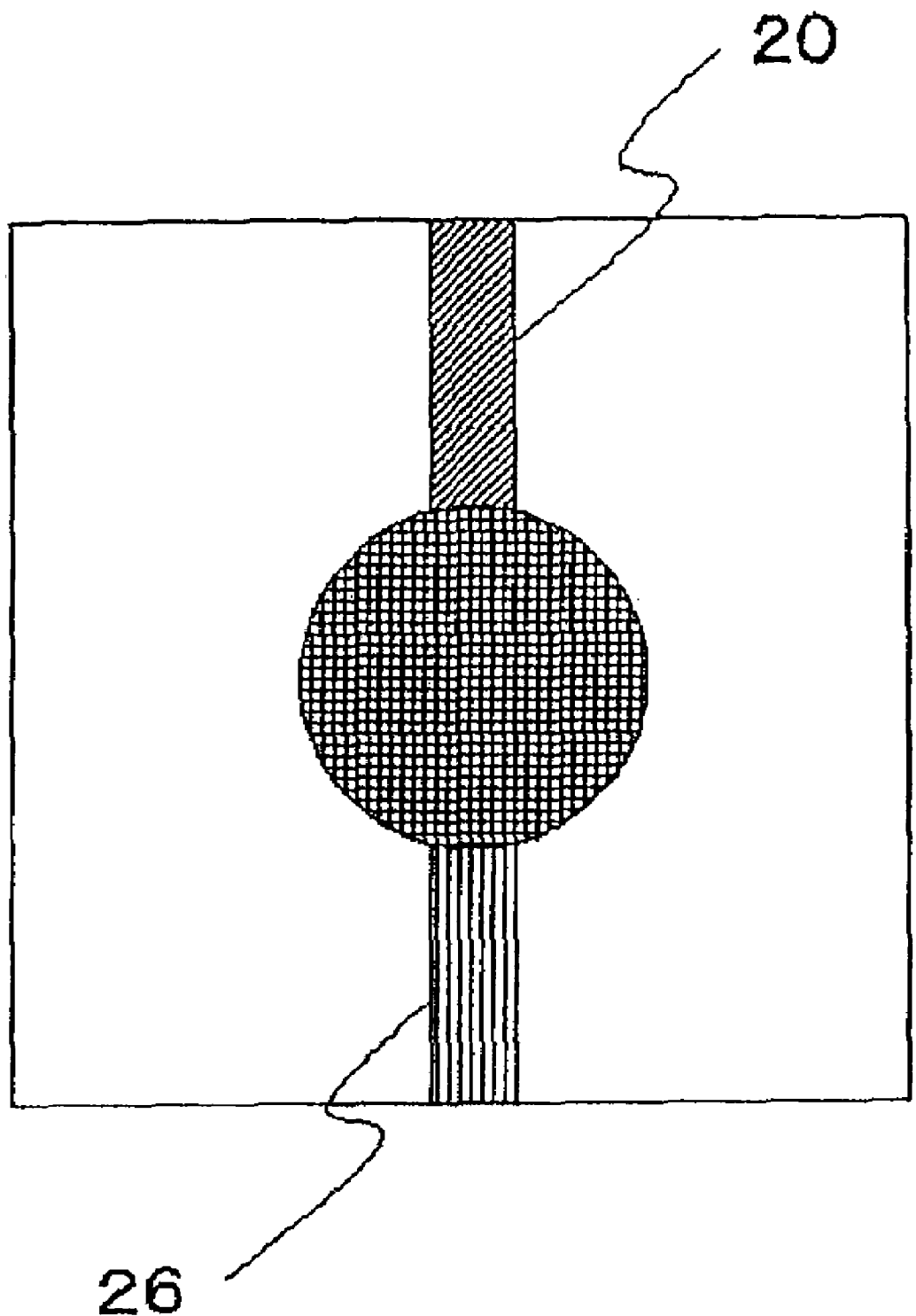
FIG. 3 is a top plan view of the first example of the optical modulator according to the present invention.

FIG. 3 is a top plan view of the optical modulator. In optical modulator 15, the electric capacitance must be made small in order to realize high-speed modulation. Specifically, the electrodes are preferably made in minimum dimensions which match the diameter of incident laser light 11. In this example, the upper transparent electrode and lower transparent electrode are made to have a diameter of 30 µm, and wiring patterns are formed in opposite directions therefrom. A lift-off method is used for forming the electrodes. After a resist mask is formed by an optical exposure method, an ITO film is formed by a sputtering method.

It is also necessary to reduce the electric resistance of wires associated with the electrodes for realizing high-speed modulation. In this example, a thick Cu layer having low electric resistance is disposed on the transparent electrode wires. The thick Cu layer has a thickness of 1 µm. Other than Cu, low resistance metals such as Au, Al and the like can also be used for such a thick metal layer.

In the present invention described above, the use of the aerosol deposition method for depositing the electro-optical layer constitutes one feature of the present invention. The reason for using the aerosol deposition method will be described below in brief.

As described in the aforementioned description of the related art and the abstract of the invention, one object of the present invention is to provide an ultra-high speed optical modulator which operates at frequencies exceeding 40 GHz. For realizing a compact optical modulator which maintains good modulation frequency characteristics up to ultra-high frequencies, a lumped-constant load is more preferable than a distributed-constant load due to the fact that the former facilitates impedance matching with a driving source. The electro-optical modulator of the present invention is a capacitive lumped-constant load. An optimal capacitance for matching a driving source is determined from the frequency and the output impedance of the driving source. The capacitance is determined by the area of electrodes, the dielectric constant of a medium between the electrodes (PZT that has the composition mentioned above has a specific dielectric constant of 100), and the thickness of the medium. As described above, the diameter of the electrodes is determined to be 30 µm based on the diameter of the laser beam incident on the optical modulator. Therefore, a minimum electrode area can be calculated from the radius of the electrodes, i.e., 15 µm and the Ludolph's number. The thickness of the electro-optical layer is 6 µm as mentioned above, so that the capacitance is calculated to be 0.16 pF. In the optical modulator which is manufactured under the foregoing conditions, the absolute value of reactance of a load at 40 GHz substantially matches the impedance of the driving source 50 Ω.

In the present state of art technologies, it is impossible to form a ferroelectric transparent film having a thickness as large as 6 µm on a substrate including dielectric substrates in arbitrary compositions, metal substrates, semiconductor substrates, resin substrates made of plastic and polymer materials, and the like, either by a sputtering method or by a sol gel method, and the aerosol deposition method is the only one which makes it possible to form such a thick ferroelectric transparent film on the substrate. According to this deposition method, the operating frequency can be further increased because the aerosol deposition method can deposit a ferroelectric transparent film having a thickness even larger than 6 µm. It is therefore possible to create an optical modulator which operates at frequencies exceeding 200 GHz.

Figure 4:
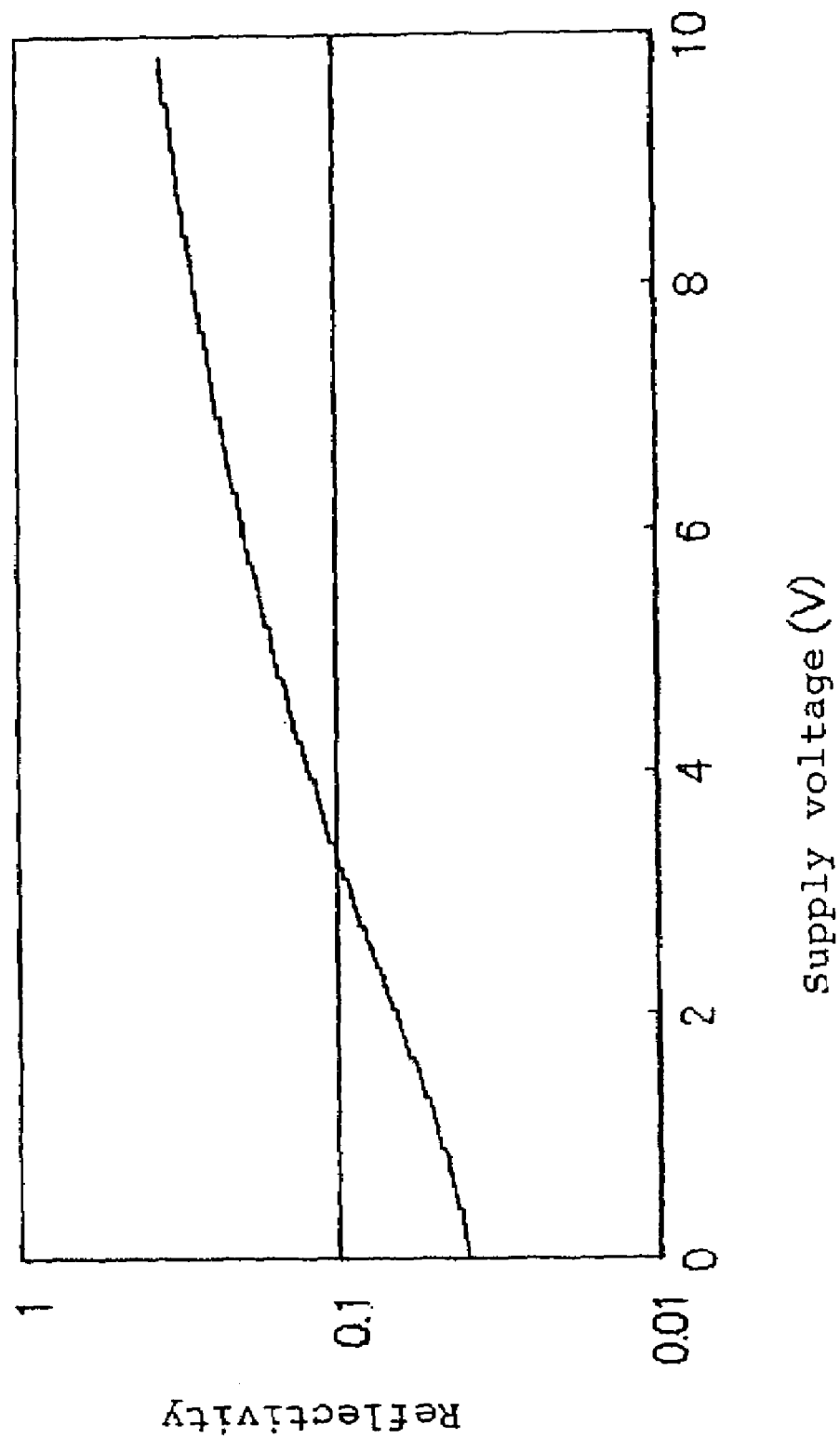
FIG. 4 is a graph showing the dependence of the reflectivity on the applied voltage of the optical modulator in the first example manufactured according to the present invention.

FIG. 4 shows the dependence of the reflectivity on the applied voltage of optical modulator 15 in this example, where the horizontal axis represents the voltage, and the vertical axis represents the reflectivity. The reflectivity increases as a higher voltage is applied, and a modulation factor of approximately 10 dB can be obtained when the applied voltage is 10 V.

[Second Example of Optical Modulator]

Figure 5:
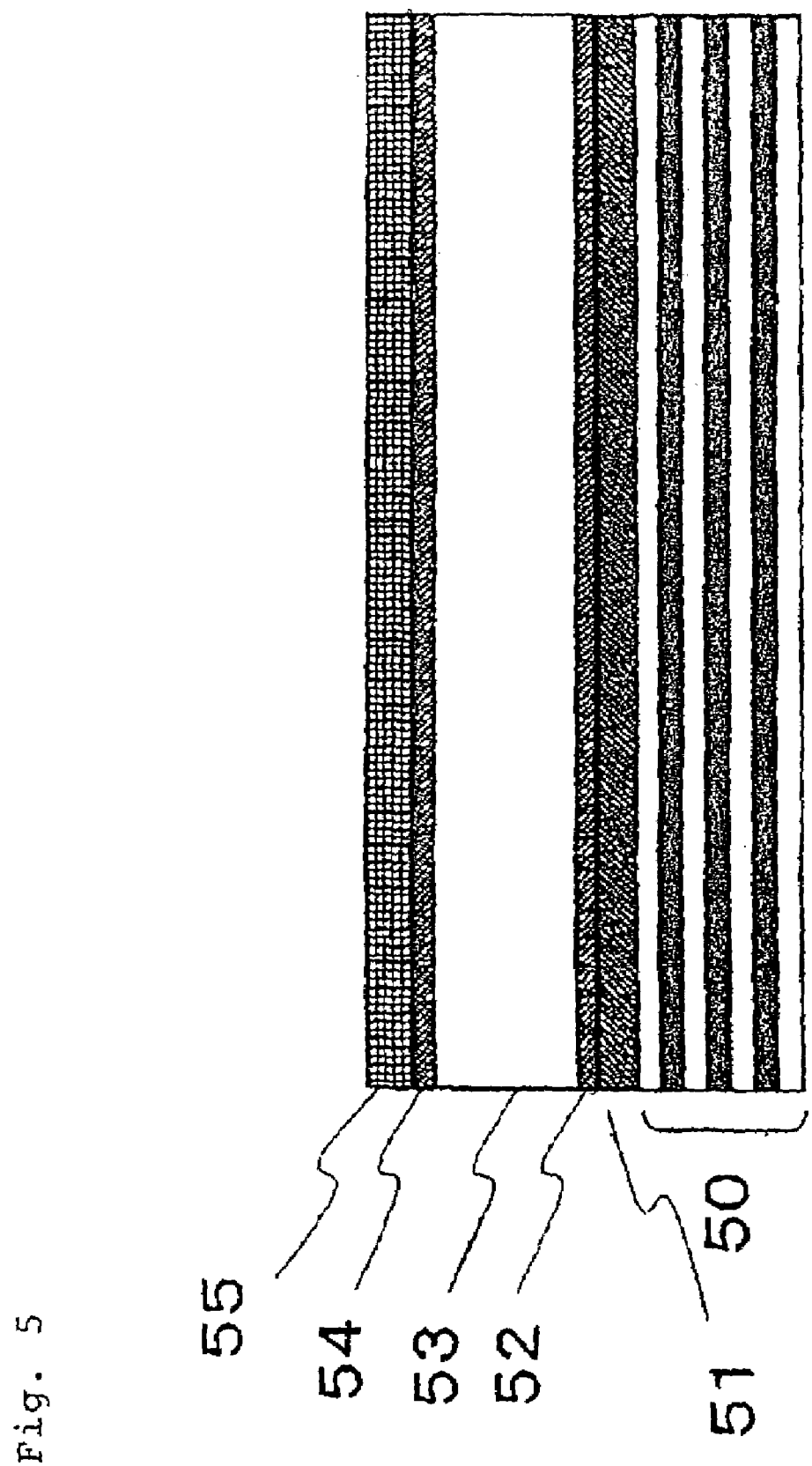
FIG. 5 is a diagram illustrating the structure, viewed in cross-section, of a second example of the optical modulator according to the present invention.

FIG. 5 is a cross-sectional view illustrating the structure of a second example of the optical modulator according to the present invention. While this optical modulator also comprises a Fabry-Perot resonator, as is the case with the optical modulator of the first example, the second example differs from the first example in that the upper reflective film and electrode film are replaced with translucent metal film 55 which has the functions of the two films.

Lower dielectric multi-layer reflective layer 50, lower electrode layer 51, lower intermediate layer 52, electro-optical layer 53, and upper intermediate layer 54 are similar in their respective compositions and forming methods to those in the first example. Translucent metal film 55 is composed of two layers, a Ti layer and an Au layer. After a Ti film of 3 nm thick is deposited, an Au film of 15 nm thick is deposited to form translucent metal film 55 in a two-layer structure composed of Ti/Au. The Ti film has the function of an adhesive layer for the Au layer. A sputtering method is used to form their films.

Figure 6:
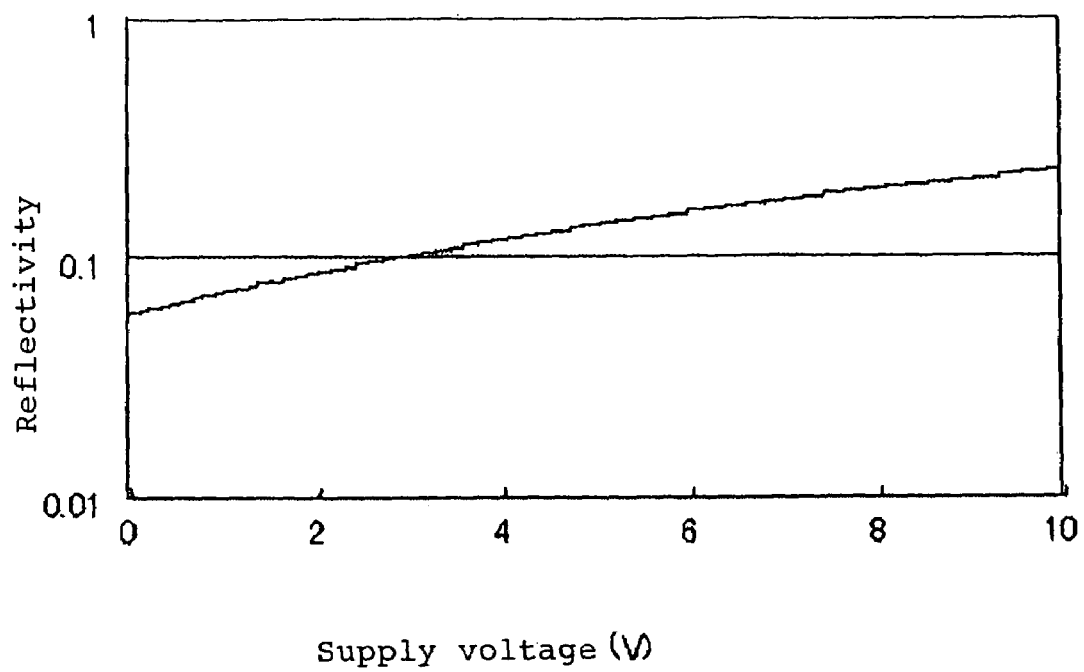
FIG. 6 is a graph showing the dependence of the reflectivity on the applied voltage of the optical modulator in the second example manufactured according to the present invention.

FIG. 6 shows the dependence of the reflectivity on the applied current of the optical modulator in the second example, where the horizontal axis represents the voltage, and the vertical axis represents the reflectivity. The reflectivity increase as a higher voltage is applied, and a modulation factor of approximately 5 dB can be obtained when the applied voltage is 10 V. While the second example exhibits a lower modulation factor than the first example, the second example has the characteristic that an optical modulator can be manufactured inexpensively because of its simple structure.

[Third Example of Optical Modulator]

Figure 7:
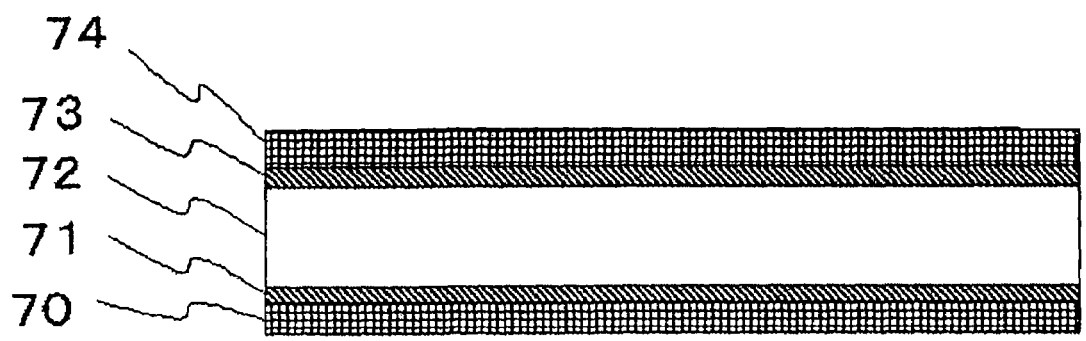
FIG. 7 is a diagram illustrating the structure, viewed in cross-section, of a third example of the optical modulator according to the present invention.

FIG. 7 is a cross-sectional view illustrating the structure of a third example of the optical modulator. While this optical modulator also comprises a Fabry-Perot resonator, as is the case with the first and second examples, the third example differs from the first and second examples in that the lower and upper reflective films and electrode films are replaced with translucent metal films 70, 74, respectively, each of which has the functions of the two films.

Lower intermediate layer 71, electro-optical layer 72, and upper intermediate layer 73 are similar in their respective compositions and manufacturing methods to those of the optical modulator in the first example. Lower translucent metal film 70 is composed of three layers of Ti, Au, Ti, and is formed by a sputtering method. In the three layers which make up lower translucent metal film 70, the underlying Ti film has a thickness of 3 nm; the overlying Au film 6 nm; and the overlying Ti film 3 nm. Each of the Ti films has function as an adhesive layer for the Au layer. Upper translucent metal film 74 is composed of Ti and Au layers. After a Ti film (3 nm thick) is deposited, an Au film (12 nm thick) is deposited to form translucent metal film 55 in a two-layer structure composed of Ti/Au. A sputtering method is used to form the Ti and Au films.

Figure 8:
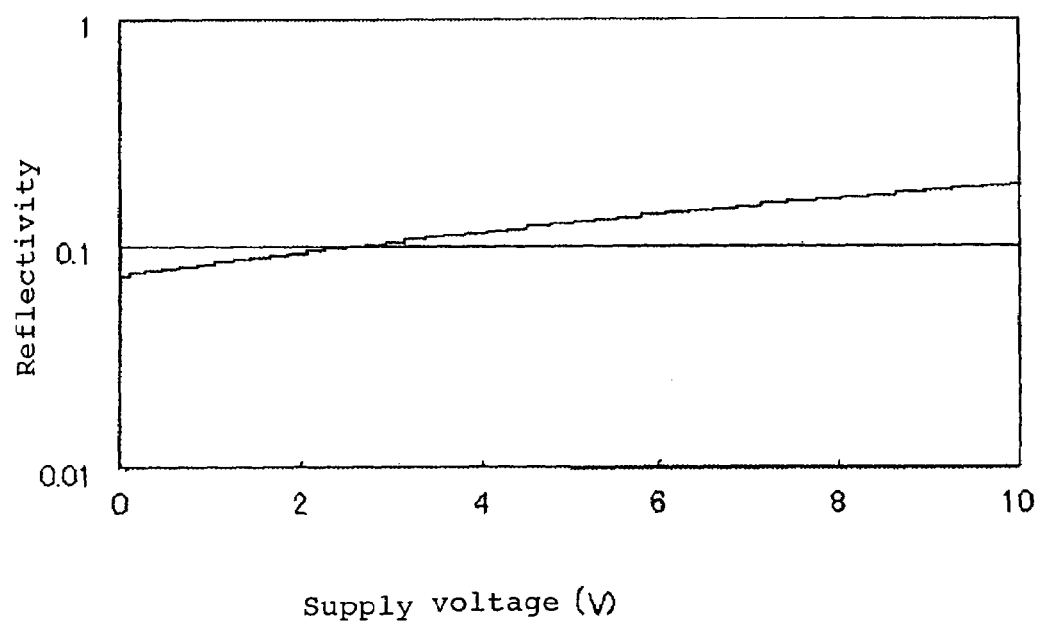
FIG. 8 is a graph showing the dependence of the reflectivity on the applied voltage of the optical modulator in the third example manufactured according to the present invention.

FIG. 8 shows the dependency of the reflectively on the applied voltage of the optical modulator fabricated in the third example, where the horizontal axis represents the voltage, and the vertical axis represents the reflectivity. The reflectivity increases as a higher voltage is applied, and a modulation factor of approximately 4 dB can be accomplished when the applied voltage is 10 V. While the third example exhibits a lower modulation factor than the first and second examples, the third example has the characteristic that an optical modulator can be manufactured inexpensively because of its simple structure.

To clarify the effect of the lower intermediate layer, a sample of the component films having different thicknesses was fabricated, and the transmitted light spectrum was measured for the sample. The sample was composed of a glass substrate, a Ti film (3 nm thick), an Au film (20 nm thick), a Ti film (3 nm thick), a $Ta_2O_5$ film (X nm thick), and a $Pb(Zr0.6Ti0.4)O_3$ film. Each Ti film (3 nm thick), Au film (20 nm thick), Ti film (3 nm thick), and $Ta_2O_5$ film (X nm thick) was deposited by a sputtering method, while the $Pb(Zr0.6Ti0.4)O_3$ film was formed by an aerosol deposition method similar to that employed in the first example.

Figure 9:
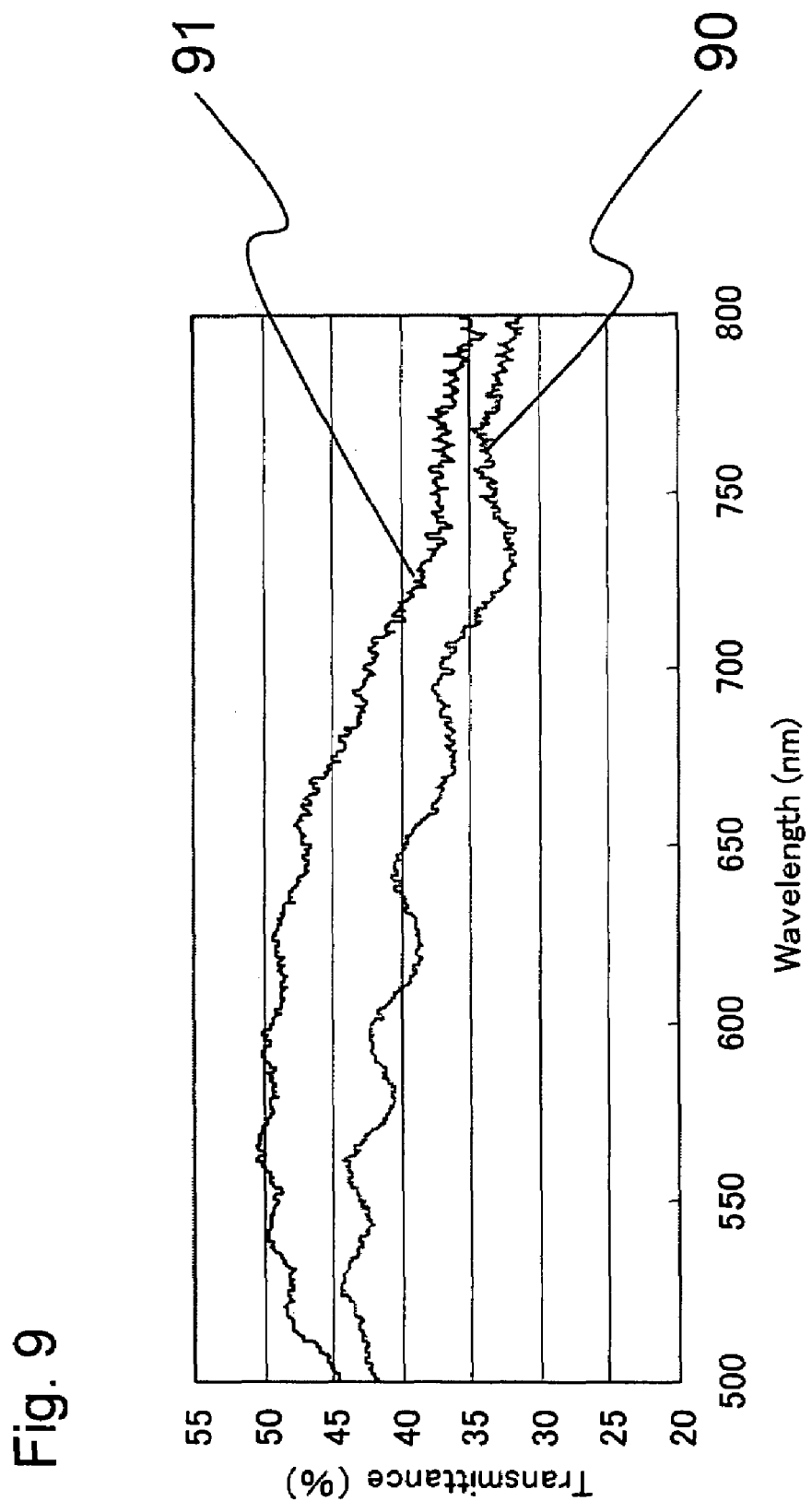
FIG. 9 is a graph showing the transmission spectrum of a sample for clarifying the effect of a lower intermediate layer.

FIG. 9 shows the transmission spectra of the sample when the thickness X of the $Ta_2O_5$ film is 10 nm and 20 nm, respectively. In transmission spectrum 90 of the lower intermediate layer having the thickness X equal to 20 nm, vibrations due to optical interference are clearly observed. On the other hand, in transmission spectrum 91 of the lower intermediate layer having the thickness X of 10 nm, vibrations due to optical interference are not clear. Consequently, the lower intermediate layer needs a thickness X of 20 nm or more in order to form part of the resonator.

For clarifying the effect of polishing the electro-optical layer created by the aerosol deposition method, measurements were made on changes in the transmitted light spectrum when the electro-optical layer was polished and when it was not polished. A sample was composed of a glass substrate, a Ti film (3 nm thick), an Au film (20 nm thick), a Ti film (3 nm thick), a $Ta_2O_5$ film (50 nm thick), and $Pb(Zr0.6Ti0.4)O_3$ film. Each Ti film (3 nm thick), Au film (20 nm thick), Ti film (3 nm thick), and $Ta_2O_5$ film (50 nm thick) was deposited by a sputtering method, while the $Pb(Zr0.6Ti0.4)O_3$ film was formed by an aerosol deposition method similar to that employed in the first example.

Figure 10:
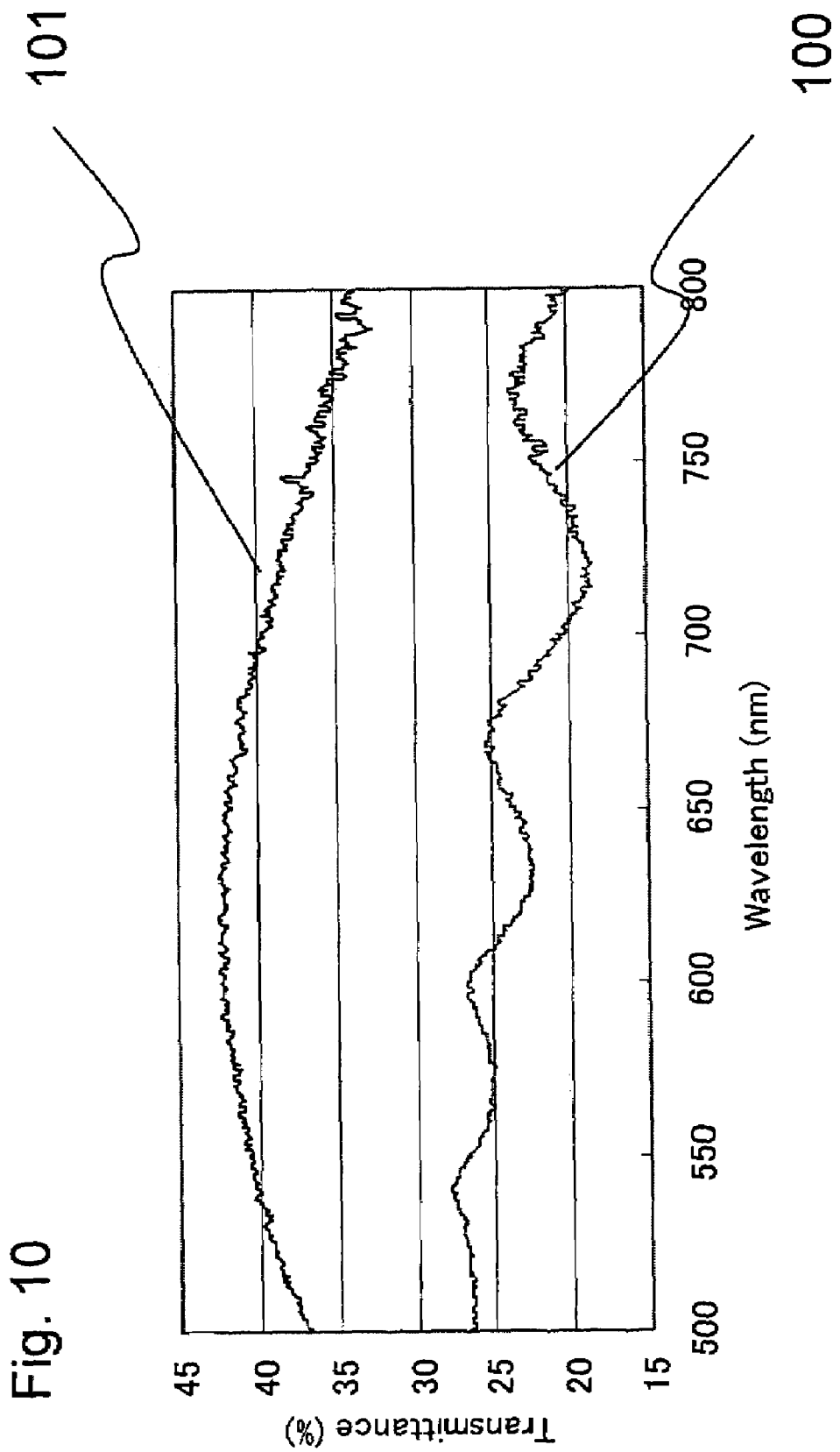
FIG. 10 is a graph showing the transmission spectrum of a sample for clarifying the effect of polishing an electro-optical layer manufactured by an aerosol deposition method.

FIG. 10 shows the transmission spectrum of the sample illustrated in FIG. 9. In transmission spectrum 100 for the polished electro-optical layer, vibrations due to optical interference are clearly observed. On the other hand, in transmission spectrum 101 for the electro-optical layer that is not polished, vibrations due to optical interference are not clear. Consequently, the electro-optical layer created by the aerosol deposition method must be polished for forming part of a resonator.

[Fourth Example of Optical Modulator]

Figure 11:
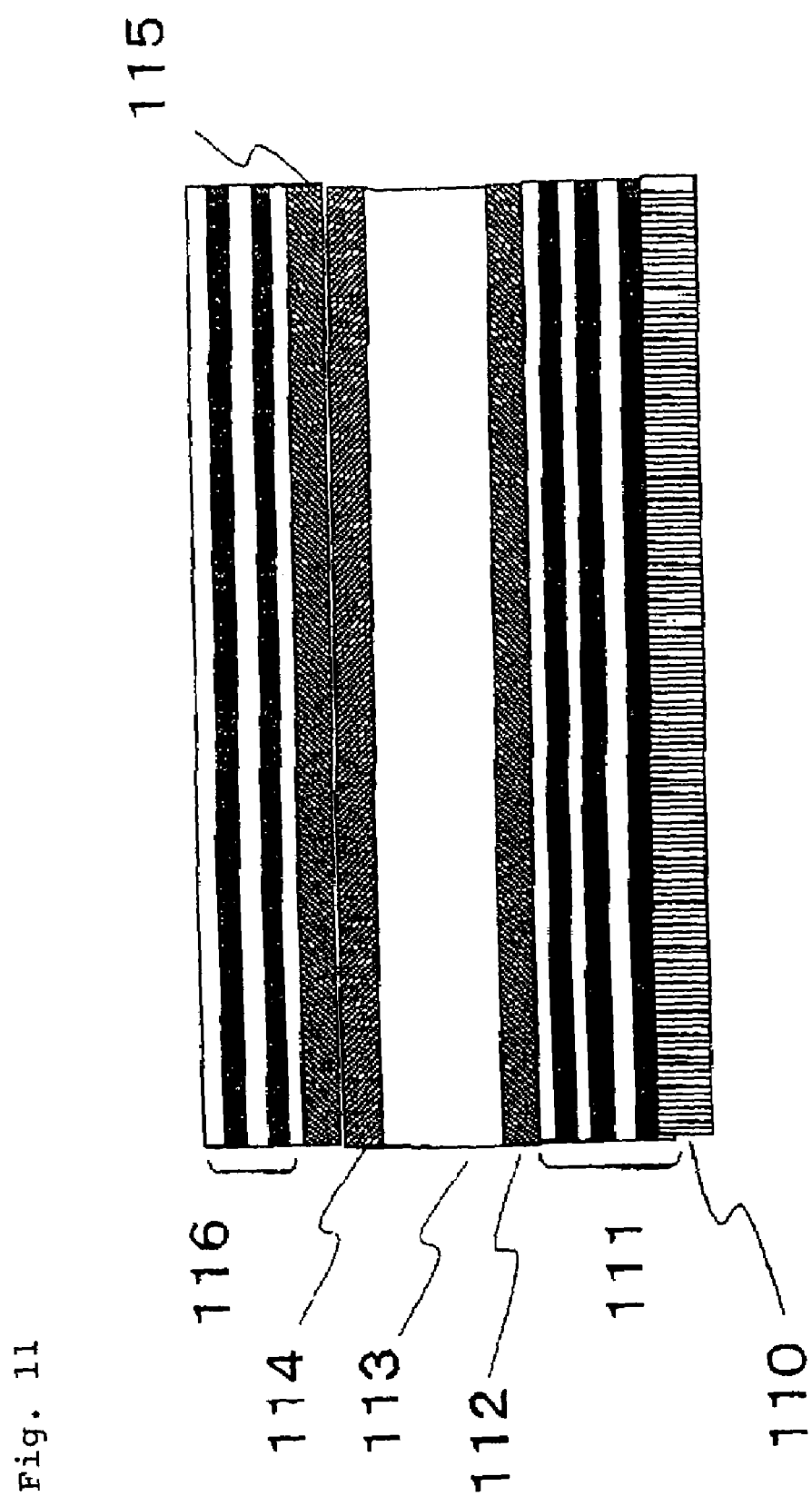
FIG. 11 is a diagram illustrating the structure, viewed in cross-section, of a fourth example of the optical modulator according to the present invention.

FIG. 11 is a cross-sectional view illustrating the structure of a fourth example of the optical modulator according to the present invention. While this optical modulator comprises a Fabry-Perot resonator, as is the case with the first example, the fourth example differs from the first example in that electro-optical layer 113 is made of a thin layer of bulk ceramics.

First, adhesive layer 110 is formed on the end face of a waveguide. Adhesive layer 110 is made of an epoxy-based resin material, the refractive index of which is the same as that of the material used to form the waveguide. Lower dielectric multi-layer film 111 and lower electrode layer 112 have been previously formed on electro-optical layer 113 made of a thin layer of bulk ceramics. Lower dielectric multi-layer reflective layer 111 and lower electrode layer 112 are similar in composition and manufacturing method to those in the first example. The material used for electro-optical layer 113 is ceramics expressed by $(Pb0.91La0.09)(Zr0.65Ti0.35)O_3$, the thickness of which is reduced to 10 µm by polishing.

Electro-optical layer 113, on which lower dielectric multi-layer reflective layer 111 and lower electrode layer 112 is formed, adheres to adhesive layer 110 while maintaining the parallelism. Subsequently, upper intermediate layer 114 is deposited by an ion plating method on the surface of electro-optical layer 113 opposite to the surface which adheres to adhesive layer 110. Upper intermediate layer 114 is formed for purposes of adjusting the optical thickness between the reflective layers required to build a Fabry-Perot resonator, i.e., the sum total of optical thicknesses of electro-optical layer 113 and upper intermediate layer 114. Upper intermediate layer 114 is deposited such that the sum total of the optical thicknesses reaches a predetermined thickness while measuring the optical spectrum on a monitor during the deposition. In this example, upper intermediate layer 114 (58 nm thick) was laminated on electro-optical layer 113 to form a Fabry-Perot resonator.

Finally, upper electrode layer 115 and upper dielectric multi-layer reflective layer 116 are formed on upper intermediate layer 114. Upper electrode layer 115 and upper dielectric multi-layer reflective layer 116 are similar in composition and manufacturing method to those in the first embodiment. However, upper electrode layer 115 is deposited at a temperature of 150° C.

When a voltage was applied to the optical modulator fabricated in this example, a modulation factor of 7 dB was obtained when the applied voltage was 5 V. In this example, while the manufacturing process is complicated due to the use of bulk ceramics, this example is suitable for a device in which a high temperature process cannot be applied, and for a composite device with an electro-optical integrated circuit because the manufacturing process does not include high-temperature heat treatment.

Second Embodiment

Figure 12:
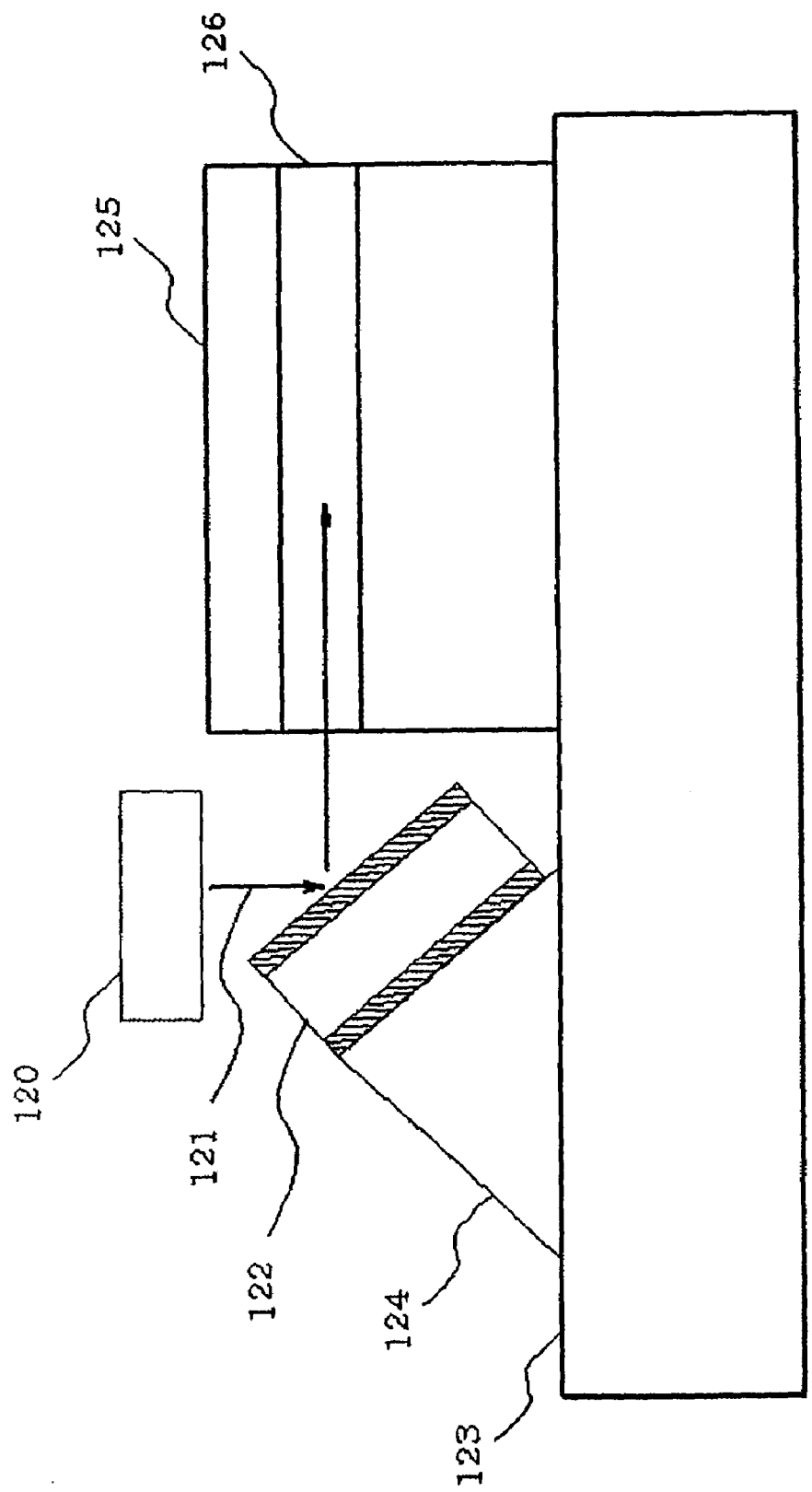
FIG. 12 is a diagram illustrating the configuration of a second embodiment of the optical modulation system according to the present invention.

FIG. 12 illustrates the configuration of a second embodiment of a optical modulation system according to the present invention. Laser light 121 emitted from vertically confined surface emitting laser (VCSEL) 120 is incident on optical modulator 112. Optical modulator 122 is similar in configuration and action to the first to fourth examples of the optical modules described in the first embodiment.

Optical modulator 122 is formed on the side surface of pyramidal protrusion 124 created on substrate 123. While substrate 123 is made of Si, substrate 123 may be formed of quartz or the like. The shape of pyramidal protrusion 124 can be formed by anisotropic etching of Si. Alternatively, a metal member in a pyramidal shape fabricated by compression molding may adhere to substrate 123 to form protrusive shape 124. Further alternatively, protrusive shape 124 may be formed on substrate 123 by direct molding of low melting point glass. VCSEL 120, optical modulator 122, and optical waveguide 125 are positioned such that reflected light is incident on core layer 126 of optical waveguide 125 when a voltage is applied. By applying a voltage to optical modulator 122, the optical path can be changed to turn on and off laser light which travels to waveguide 125.

Third Embodiment

Figure 13:
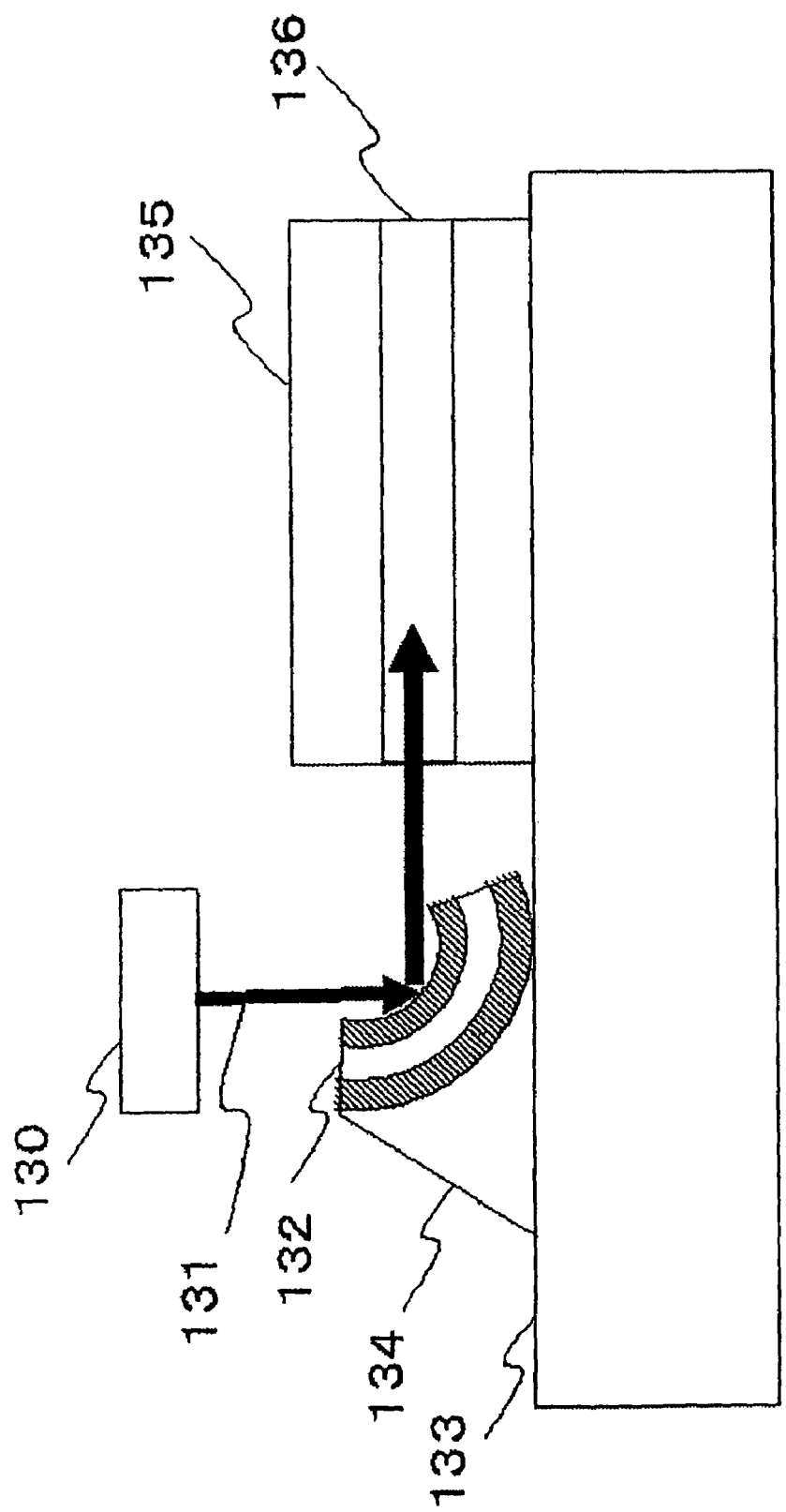
FIG. 13 is a diagram illustrating the configuration of a third embodiment of the optical modulation system according to the present invention.

FIG. 13 illustrates the configuration of a third embodiment of the optical modulation system according to the present invention.

Laser light 131 emitted from vertically confined surface emitting laser (VCSEL) 130 is incident on optical modulator 132. Optical modulator 132 is formed on the side surface of pyramidal protrusion 134 disposed on substrate 133.

The side surface of protrusion 134, on which optical modulator 132 is disposed, is shaped into a two-dimensional concave. Optical modulator 132 is in an arcuate shape, as viewed in cross-section, so that the convex of optical modulator 132 fits the shape of the concave of protrusion 134. Light which has undergone optical modulation and travels towards optical waveguide 135 is focused by the concave shape of optical modulator 132. The curvature of the concave shape of optical modulator 132 is set so that the light image emitted by VCSEL 130 is focused on the end surface of optical waveguide 135 and the focused size is the same as the waveguide mode size of optical waveguide 135.

Optical modulator 132 is similar in layer structure to the first to fourth examples of the optical modulators described in the first embodiment. A pyramidal metal member fabricated through compression molding can adhere to substrate 133 to form pyramidal protrusion 134. Alternatively, protrusion 134 may be formed on substrate 133 through direct molding of low-melting point glass.

VCSEL 130, optical modulator 132, and optical waveguide 135 are positioned so that reflected light is incident on core layer 136 of optical waveguide 135 when a voltage is applied. By applying a voltage to optical modulator 132, the optical path can be changed to turn on and off laser light which travels to waveguide 135.

Fourth Embodiment

Figure 14:
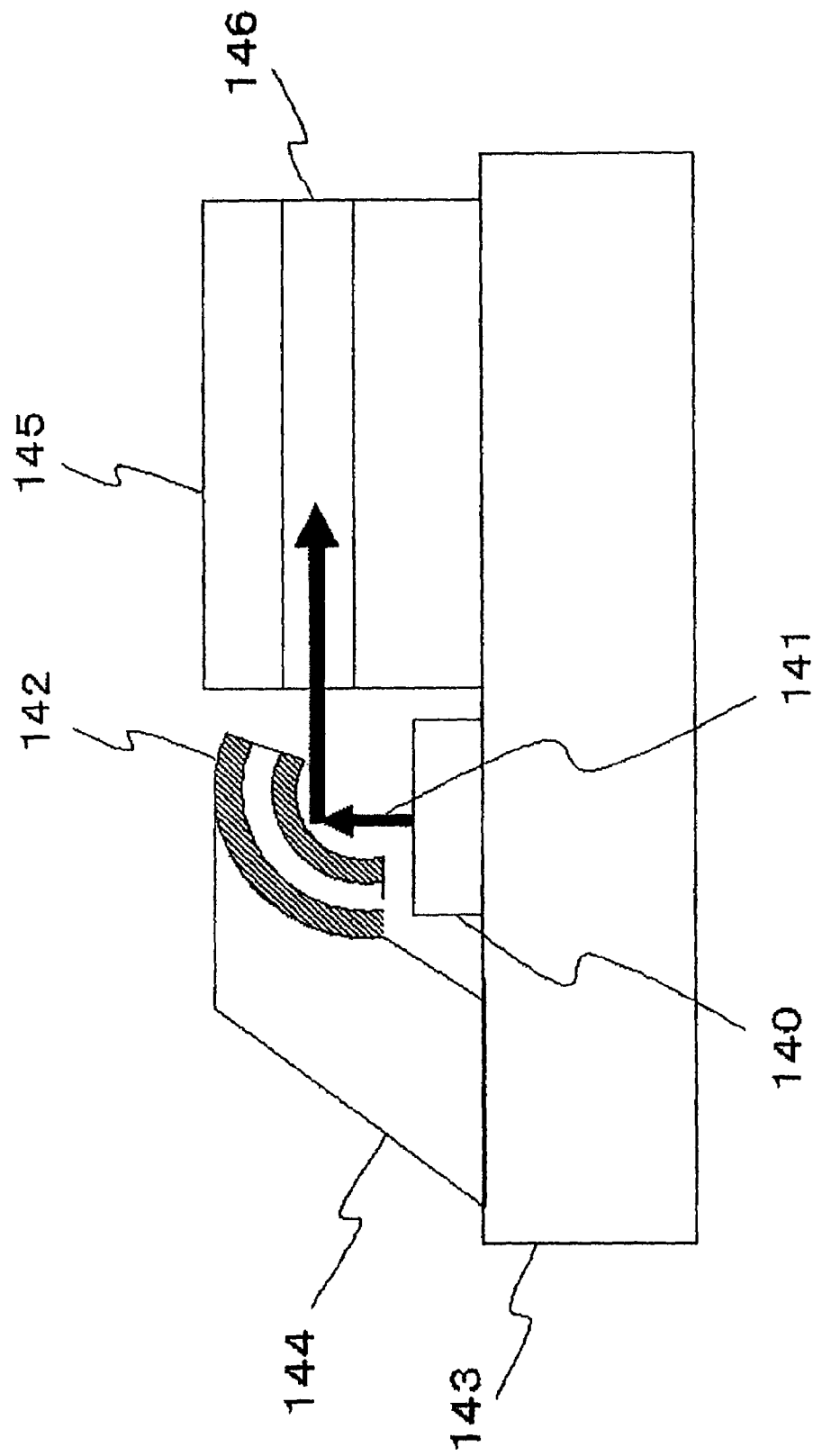
FIG. 14 is a diagram illustrating the configuration of a fourth embodiment of the optical modulation system according to the present invention.

FIG. 14 illustrates the configuration of a fourth embodiment of the optical modulation system according to the present invention.

Laser light 141 emitted from vertically confined surface emitting laser (VCSEL) 140 is incident on optical modulator 142. Optical modulator 142 is formed on the side surface of bow-shaped protrusion 144 built on substrate 143.

The side surface of bow-shaped protrusion 144 protrudes at an angle of 45 degrees from the horizontal plane. This side surface has a two-dimensional concave on which optical modulator 142 is formed. Optical modulator 142 is in an arcuate shape, as viewed in cross-section, so that the convex of optical modulator 142 fits the concave shape of protrusion 144. Light which has undergone optical modulation and travels towards optical waveguide 145 is focused by the concave shape of optical modulator 142. The curvature of the concave shape of optical modulator 142 is set so that a light image emitted by VCSEL 140 is focused on the end surface of optical waveguide 145 and the focused size is the same as the mode size of optical waveguide 145.

Optical modulator 142 is similar in layer structure to the first to fourth examples of the optical modulators described in the first embodiment. A pyramidal metal member fabricated through compression molding can adhere to substrate 143 to form protrusion 144 in a bow shape. Alternatively, bow-shaped protrusion 144 may be formed on substrate 143 through direct molding of low-melting point glass.

VCSEL 140, optical modulator 142, and optical waveguide 145 are positioned so that reflected light is incident on core layer 146 of optical waveguide 145 when a voltage is applied. By applying a voltage to optical modulator 142, the optical path can be changed to turn on and off laser light which travels to waveguide 145.

Fifth Embodiment

Figure 15:
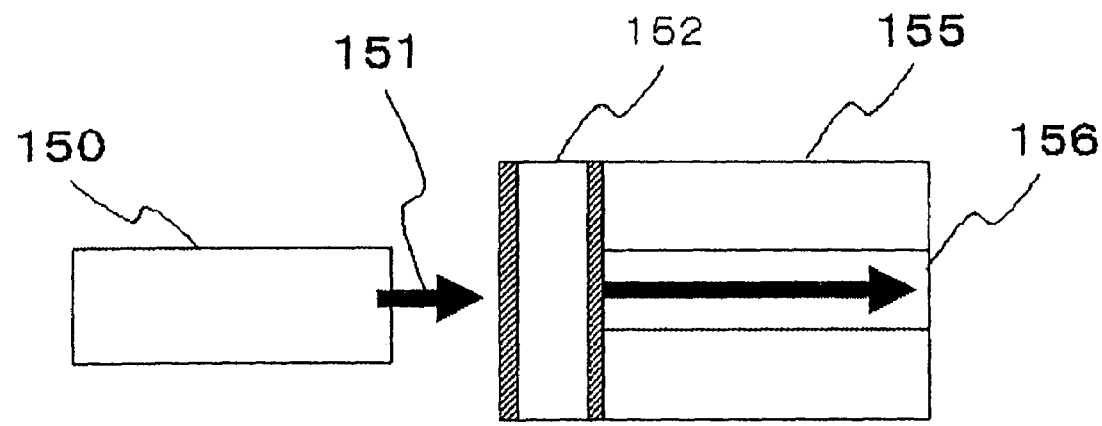
FIG. 15 is a diagram illustrating the configuration of a fifth embodiment of the optical modulation system according to the present invention.

FIG. 15 illustrates the configuration of a fifth embodiment of the optical modulation system according to the present invention.

Laser light 151 emitted from edge emitting laser 150 is incident on optical modulator 152. While optical modulator 152 is similar in basic configuration and action to the first to fourth embodiments of the optical modulators described in the first embodiment, optical modulator 152 differs from the optical modulators in the first to fourth embodiments in that the respective layers of optical modulator 152 have different thicknesses in order to build a vertically incident Fabry-Perot resonator. Optical modulator 152 is formed on the vertical end surface of optical waveguide 155, such that transmitted light from optical modulator 152 is incident on core layer 156 of optical waveguide 155. By applying a voltage to optical modulator 152, the reflectivity can be changed to turn on and off laser light which travels to optical waveguide 155.

Figure 16:
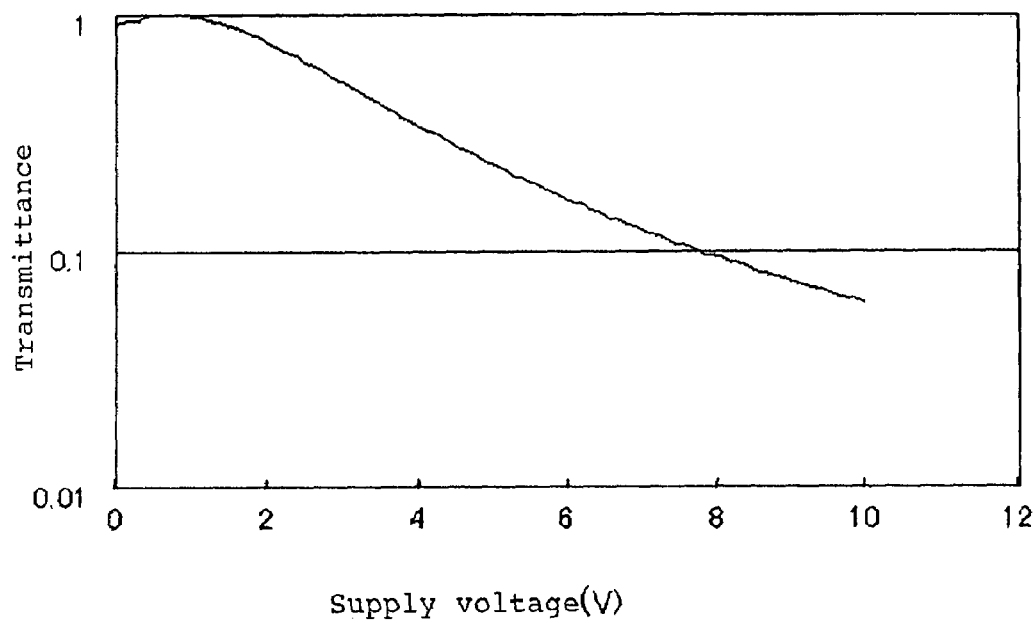
FIG. 16 is a graph showing the dependence of the reflectivity on the applied voltage of the optical modulator manufactured in the fifth embodiment of the optical modulation system according to the present invention.

FIG. 16 shows the dependence of the transmittance on an applied voltage of optical modulator 152 in the fifth embodiment, where the horizontal axis represents the voltage, and the vertical axis represents the reflectivity. The transmittance increases as a higher voltage is applied, and a modulation factor of 10 dB or more can be obtained when the applied voltage is 10 V.

Sixth Embodiment

Figure 17:
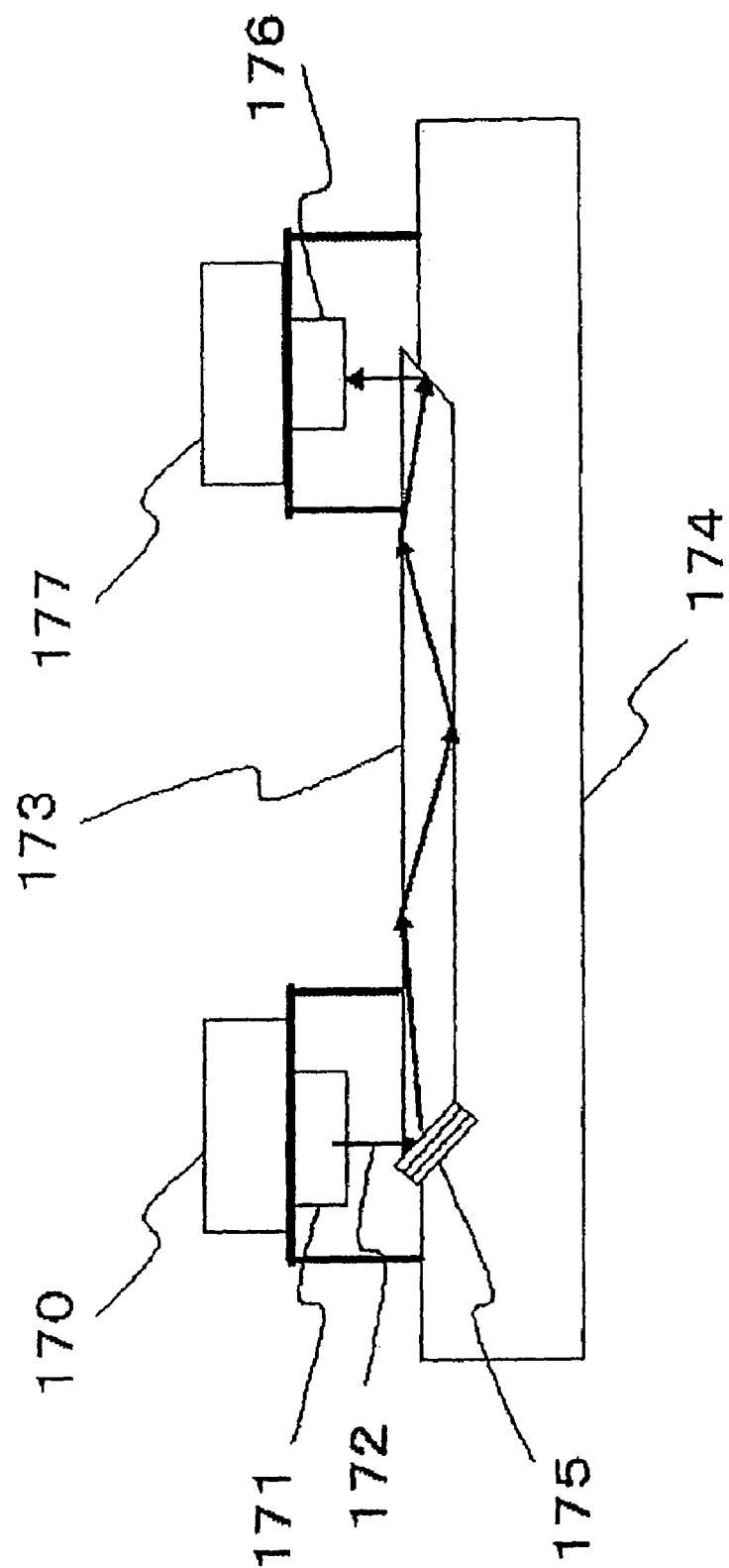
FIG. 17 is a diagram illustrating the configuration of one embodiment of an interconnection according to the present invention.

FIG. 17 illustrates the configuration of an interconnection according to a sixth embodiment of the present invention. An electric signal delivered from LSI 170 is applied to optical modulator 175. Continuous laser light 172 emitted from vertically confined surface emitting laser (VCSEL) 171 is incident on an end region of optical waveguide 173. Optical waveguide 173 is formed on substrate 174. The end region of optical waveguide 173 is processed to taper at an angle of 45 degrees, and optical modulator 175 is formed on the tapered surface.

By modulating the voltage of the output signal supplied from LSI 170 to optical modulator 175, the optical path can be changed to turn on and off the laser light applied to optical waveguide 173. Optical modulator 175 is configured to reflect laser light from optical waveguide 173 when a voltage is applied, and the position of optical modulator 175 is set so that the reflected light is incident on the core layer of optical waveguide 173. Optical modulator 175 is similar in configuration and action to the first to fourth examples of the optical modulators described in the first embodiment.

The other end region of optical waveguide 173 opposite to the end region on which optical waveguide 173 is formed is also processed to taper at an angle of 45 degrees. This tapered end surface induces a 90 degree change in the optical path of laser light on which a signal is multiplexed and which travels through optical waveguide 173. Laser light emitted from the other end of optical waveguide 173 is incident on photo-detector 176, and is converted to an electric signal by photo-detector 176. The electric signal opto-electrically converted by photo-detector 176 is applied to LSI 177.

According to the interconnection configured as described above, an electric signal (information) can be converted to an optical signal and can be transmitted between LSI 170 and LSI 177. The transmission of information through an optical signal enables high-speed communications using optical pass which are immune to disturbances caused by electromagnetic noise.

When the optical modulator of the present invention described above, and a optical modulation system incorporating the optical module is used in an optical communication device, particularly, an optical transmitter in an optical fiber communication system and a spatial propagation optical communication system, it is possible to provide an optical communication system at high speeds in a range of 40 to 200 Gbps.

While preferred embodiments of the present invention have been described using specific terms, such description is for illustrative purposes only, and it is to be understood that changes and variations may be made without departing from the spirit or scope of the following claims.

The invention claimed is:

1. A optical modulation system comprising:
    a light source;
    an optical modulator driven by an external driving source for modulating light emitted from said light source; and
    an optical waveguide for guiding modulated light modulated by said optical modulator,
    wherein said optical modulator is a Fabry-Perot resonator type optical modulator formed on a substrate, said optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and said optical modulator has a reactance, an absolute value of which is higher than an impedance of said external driving source in a frequency range equal to or lower than 200 GHz.

2. The optical modulation system according to claim 1, wherein:
    said optical waveguide has an end surface inclined with respect to an optical axis of said optical waveguide,
    said optical modulator is formed on an inclined surface, and
    said light source is disposed such that the light emitted therefrom is transmitted through a side surface of said optical waveguide and is incident on said optical modulator.

3. The optical modulation system according to claim 1, wherein:
    said optical waveguide has an end surface vertical to an optical axis of said optical waveguide,
    said optical modulator is formed on a vertical surface, and
    said light source is disposed such that the light emitted therefrom is incident on said optical modulator at right angles.

4. The optical modulation system according to claim 1, further comprising a lens for coupling the light emitted from said light source to waveguided light of said optical waveguide.

5. The optical modulation system according to claim 1, further comprising an optical modulator support having a reflective surface for converting the emission optical axis of said light source to an optical axis of said optical waveguide, wherein said optical modulator is formed on the reflective surface of said optical modulator support.

6. The optical modulation system according to claim 5, wherein said reflective surface is concave shaped.

7. The optical modulation system according to claim 6, wherein said concave has a curvature for focusing light emitted from said light source on said optical waveguide.

8. A optical modulation system comprising:
    a light source;
    an optical modulator for modulating light emitted from said light source; and
    an optical waveguide for guiding modulated light modulated by said optical modulator,
    wherein said optical modulator is a Fabry-Perot resonator type optical modulator formed on a substrate, said optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and said electro-optical layer has a linear electro-optical effect.

9. The optical modulation system according to claim 8, wherein:
    said optical waveguide has an end surface inclined with respect to the optical axis of said optical waveguide,
    said optical modulator is formed on the inclined surface, and
    said light source is disposed such that the light emitted therefrom is transmitted through a side surface of said optical waveguide and is incident on said optical modulator.

10. The optical modulation system according to claim 8, wherein:
    said optical waveguide has an end surface vertical to an optical axis of said optical waveguide,
    said optical modulator is formed on a vertical surface, and
    said light source is disposed such that the light emitted therefrom is incident on said optical modulator at right angles.

11. The optical modulation system according to claim 8, further comprising a lens for coupling the light emitted from said light source to waveguided light of said optical waveguide.

12. The optical modulation system according to claim 8, further comprising an optical modulator support having a reflective surface for converting the emission optical axis of said light source to the optical axis of said optical waveguide, wherein said optical modulator is formed on the reflective surface of said optical modulator support.

13. The optical modulation system according to claim 12, wherein said reflective surface is concave shaped.

14. The optical modulation system according to claim 13, wherein said concave has a curvature for focusing light emitted from said light source on said optical waveguide.

15. An optical interconnect device having an optical modulation system, said optical modulation system comprising:
    a substrate;
    a light source having an emission optical axis vertical to the surface of said substrate;

an optical waveguide having an optical axis parallel with the surface of said substrate; and an optical modulator driven by an external driving source for modulating light emitted from said light source, wherein said optical modulator is a Fabry-Perot resonator type optical modulator formed on a substrate, said optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and said optical modulator has a reactance, the absolute value of which is higher than the impedance of said external driving source in the frequency range equal to or lower than 200 GHz, said optical waveguide has an end surface inclined with respect to the optical axis of said optical waveguide, and said optical modulator is formed on the inclined surface, and said light source is disposed such that the light emitted therefrom is transmitted through a side surface of said optical waveguide and is incident on said optical modulator.

16. An optical interconnect device having a optical modulation system, said optical modulation system comprising:

a substrate;

a light source having an emission optical axis vertical to the surface of said substrate;

an optical waveguide having an optical axis parallel with the surface of said substrate; and an optical modulator for modulating light emitted from said light source, wherein said optical modulator is a Fabry-Perot resonator type optical modulator formed on a substrate, said optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and said electro-optical layer has a linear electro-optical effect, said optical waveguide has an end surface inclined with respect to the optical axis of said optical waveguide, and said optical modulator is formed on the inclined surface, and said light source is disposed such that the light emitted therefrom is transmitted through a side surface of said optical waveguide and is incident on said optical modulator.

17. An optical interconnect device having a optical modulation system, said optical modulation system comprising:

a substrate;

a light source having an emission optical axis vertical to the surface of said substrate;

an optical waveguide having an optical axis parallel with the surface of said substrate;

an optical modulator support having a reflective surface for converting the emission optical axis of said light source to the optical axis of said optical waveguide; and an optical modulator driven by an external driving source and formed on the reflective surface of said optical modulator support for modulating light emitted from said light source, wherein said optical modulator is a Fabry-Perot resonator type optical modulator formed on a substrate, said optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and said optical modulator has a reactance, the absolute value of which is higher than the impedance of said external driving source in the frequency range equal to or lower than 200 GHz.

18. An optical interconnect device having a optical modulation system, said optical modulation system comprising:

a substrate;

a light source having an emission optical axis vertical to the surface of said substrate;

an optical waveguide having an optical axis parallel with the surface of said substrate;

an optical modulator support having a reflective surface for converting the emission optical axis of said light source to the optical axis of said optical waveguide; and an optical modulator formed on the reflective surface of said optical modulator support for modulating light emitted from said light source, wherein said optical modulator is a Fabry-Perot resonator type optical modulator formed on a substrate, said optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and said electro-optical layer has a linear electro-optical effect.

19. An optical communication device having a optical modulation system, said optical modulation system comprising:

a substrate;

a light source having an emission optical axis vertical to the surface of said substrate;

an optical waveguide having an optical axis parallel with the surface of said substrate; and an optical modulator driven by an external driving source for modulating light emitted from said light source, wherein said optical modulator is a Fabry-Perot resonator type optical modulator formed on a substrate, said optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and said optical modulator has a reactance, the absolute value of which is higher than the impedance of said external driving source in the frequency range equal to or lower than 200 GHz, said optical waveguide has an end surface inclined with respect to the optical axis of said optical waveguide, and said optical modulator is formed on the inclined surface, and said light source is disposed such that the light emitted therefrom is transmitted through a side surface of said optical waveguide and is incident on said optical modulator.

20. An optical communication device having a optical modulation system, said optical modulation system comprising:

a substrate;

a light source having an emission optical axis vertical to the surface of said substrate;

an optical waveguide having an optical axis parallel with the surface of said substrate; and an optical modulator for modulating light emitted from said light source, wherein said optical modulator is a Fabry-Perot resonator type optical modulator formed on a substrate, said optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and said electro-optical layer has a linear electro-optical effect, said optical waveguide has an end surface inclined with respect to the optical axis of said optical waveguide, and said optical modulator is formed on the inclined surface, and said light source is disposed such that the light emitted therefrom is transmitted through a side surface of said optical waveguide and is incident on said optical modulator.

21. An optical communication device having a optical modulation system, said optical modulation system comprising:

a substrate;

a light source having an emission optical axis vertical to the surface of said substrate;

an optical waveguide having an optical axis parallel with the surface of said substrate;

an optical modulator support having a reflective surface for converting the emission optical axis of said light source to the optical axis of said optical waveguide; and an optical modulator driven by an external driving source for modulating light emitted from said light source, wherein said optical modulator is a Fabry-Perot resonator type optical modulator formed on a substrate, said optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and said optical modulator has a reactance, the absolute value of which is higher than the impedance of said external driving source in the frequency range equal to or lower than 200 GHz.

22. An optical communication device having a optical modulation system, said optical modulation system comprising:

a substrate;

a light source having an emission optical axis vertical to the surface of said substrate;

an optical waveguide having an optical axis parallel with the surface of said substrate;

an optical modulator support having a reflective surface for converting the emission optical axis of said light source to the optical axis of said optical waveguide; and an optical modulator formed on the reflective surface of said optical modulator support for modulating light emitted from said light source, wherein said optical modulator is a Fabry-Perot resonator type optical modulator formed on a substrate, said optical modulator includes a laminate structure comprised of an electro-optical layer, an upper electrode layer overlying the electro-optical layer and a lower electrode layer underlying the electro-optical layer to sandwich the electro-optical layer therebetween, and an upper reflective layer overlying the upper electrode layer and a lower reflective layer underlying the lower electrode layer to sandwich the upper electrode, electro-optical layer, and lower electrode layer therebetween, and said electro-optical layer has a linear electro-optical effect.

* * * * *